United States Patent
Chun et al.

(10) Patent No.: US 12,279,449 B2
(45) Date of Patent: Apr. 15, 2025

(54) SEMICONDUCTOR DEVICES HAVING UPPER AND LOWER ACTIVE CONTACTS

(71) Applicant: Samsung Electronics Co., Ltd., Suwon-si (KR)

(72) Inventors: Jung Hwan Chun, Anyang-si (KR); Seung Jae Lee, Hwaseong-si (KR); Jong Min Baek, Seoul (KR); Kyung Seok Oh, Seoul (KR); Woo Jin Lee, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 515 days.

(21) Appl. No.: 17/526,046

(22) Filed: Nov. 15, 2021

(65) Prior Publication Data

US 2022/0310805 A1  Sep. 29, 2022

(30) Foreign Application Priority Data

Mar. 29, 2021  (KR) .................. 10-2021-0040143

(51) Int. Cl.
  *H10D 30/67*  (2025.01)
  *H10D 30/62*  (2025.01)
  *H10D 62/10*  (2025.01)
  *H10D 62/13*  (2025.01)
  *H10D 64/01*  (2025.01)

(52) U.S. Cl.
  CPC ..... *H10D 30/6729* (2025.01); *H10D 30/6211* (2025.01); *H10D 30/6219* (2025.01); *H10D 30/6713* (2025.01); *H10D 30/6735* (2025.01); *H10D 30/6757* (2025.01); *H10D 62/118* (2025.01); *H10D 62/151* (2025.01); *H10D 64/01* (2025.01)

(58) Field of Classification Search
  CPC ....... H01L 29/42392; H01L 21/823431; H01L 27/0886
  See application file for complete search history.

(56) References Cited

U.S. PATENT DOCUMENTS

| | | |
|---|---|---|
| 8,237,284 B2 | 8/2012 | Lee |
| 8,436,404 B2 | 5/2013 | Bohr et al. |
| 8,836,129 B1 | 9/2014 | Hung et al. |
| 9,859,386 B2 | 1/2018 | Ho et al. |
| 10,164,111 B2 | 12/2018 | Chang et al. |

(Continued)

*Primary Examiner* — Vu A Vu
*Assistant Examiner* — Jeremy Daniel Watts
(74) *Attorney, Agent, or Firm* — Myers Bigel, P.A.

(57) ABSTRACT

Semiconductor devices having improved performance and reliability. For example, a semiconductor device may include a substrate, an active pattern extending in a first direction, on the substrate, a plurality of gate structures on the active pattern, each including a gate electrode that crosses the active pattern. A lower active contact may be connected to a source/drain pattern. A trench may expose the lower active contact, and a width of a bottom surface of the trench in the first direction may be greater than a width of an upper surface of the lower active contact in the first direction. An etching stop film may be along the bottom surface of the trench and side walls of the trench, and have an uppermost surface coplanar with an upper surface of an upper active contact that extends through the etching stop film and is connected to the lower active contact.

18 Claims, 35 Drawing Sheets

(56) References Cited

U.S. PATENT DOCUMENTS

| | | | |
|---|---|---|---|
| 10,211,095 B2 | 2/2019 | Adusumilli et al. | |
| 10,854,458 B2 | 12/2020 | Lu et al. | |
| 2020/0286781 A1 | 9/2020 | Hsieh et al. | |
| 2020/0402859 A1 | 12/2020 | Hsu et al. | |
| 2021/0343639 A1* | 11/2021 | Wang | H10D 62/151 |
| 2022/0238522 A1* | 7/2022 | Lai | H10D 30/6219 |
| 2022/0271163 A1* | 8/2022 | Wu | H10D 30/6219 |
| 2022/0310815 A1* | 9/2022 | Lee | H01L 21/76883 |
| 2022/0359700 A1* | 11/2022 | Chung | H10D 30/0198 |

* cited by examiner

SEMICONDUCTOR DEVICES HAVING UPPER AND LOWER ACTIVE CONTACTS

CROSS-REFERENCE TO RELATED APPLICATION

This application claims priority from Korean Patent Application No. 10-2021-0040143 filed on Mar. 29, 2021, in the Korean Intellectual Property Office, and all the benefits accruing therefrom under 35 U.S.C. § 119, and the entire contents of the above-identified application are herein incorporated by reference.

TECHNICAL FIELD

The present disclosure relates to semiconductor devices.

BACKGROUND

Scaling technologies for increasing a density of semiconductor devices have been proposed and investigated. For example, one such scaling technology is a multi gate transistor in which a multi-channel active pattern (or a silicon body) having a fin or nanowire shape is formed on a substrate and a gate is formed on a surface of the multi-channel active pattern.

Since such a multi gate transistor utilizes a three-dimensional channel, scaling may be performed more easily. Further, even if a gate length of the multi gate transistor is not increased, current control capability may be improved. Furthermore, a SCE (short channel effect) in which potential of a channel region is influenced by a drain voltage may be effectively suppressed.

On the other hand, as a pitch size of the semiconductor device decreases, securing a decrease in capacitance and electrical stability between contacts inside the semiconductor device may become more difficult.

SUMMARY

Aspects of the present disclosure provide a semiconductor device having improved performance and reliability.

However, the present disclosure is not restricted to the aspects and embodiments explicitly set forth herein. The above and other aspects of the present disclosure will become more apparent those of ordinary skill in the art to which the present disclosure pertains by referencing the detailed description of the present disclosure given below.

According to an aspect of the present disclosure, there is provided a semiconductor device comprising, a substrate, an active pattern extending on the substrate in a first direction, a plurality of gate structures on the active pattern, each including a gate electrode that crosses the active pattern and extends in a second direction that intersects the first direction, each gate structure including a gate capping pattern on the gate electrode thereof, a source/drain pattern between the gate structures on the active pattern, a lower active contact on and connected to the source/drain pattern, a trench that is on and that exposes the lower active contact, a width of a bottom surface of the trench in the first direction greater than a width of an upper surface of the lower active contact in the first direction, an etching stop film on the bottom surface of the trench and on side walls of the trench, and an upper active contact that extends through the etching stop film and is connected to the lower active contact. An uppermost surface of the etching stop film may be coplanar with an upper surface of the upper active contact.

According to another aspect of the present disclosure, there is provided a semiconductor device comprising, a substrate, an active pattern extending on the substrate in a first direction, a plurality of gate structures on the active pattern, each including a gate electrode that crosses the active pattern and extends in a second direction that intersects the first direction, a source/drain pattern between the gate structures on the active pattern, a lower active contact on and connected to the source/drain pattern, an interlayer insulating film that is on the substrate, that covers side walls of the lower active contact, and that includes a trench exposing the lower active contact, an etching stop film on a bottom surface of the trench and on side walls of the trench, a filling insulation film within the trench on the etching stop film, and an upper active contact that extends through the filling insulation film and the etching stop film and is connected to the lower active contact. An uppermost surface of the etching stop film may be coplanar with an upper surface of the upper active contact. The etching stop film may include a first portion on the bottom surface of the trench, and a second portion on the first portion and on the side walls of the trench. A width of the second portion in the second direction may be greater than a width of an upper surface of the lower active contact in the second direction.

According to another aspect of the present disclosure, there is provided a semiconductor device comprising, a substrate, an active pattern on the substrate and extending in a first direction, a plurality of gate structures on the active pattern, each of which include a gate electrode that crosses the active pattern and extends in a second direction that intersects the first direction and a gate capping pattern on the gate electrode, a source/drain pattern between the gate structures and on the active pattern, a lower active contact on and connected to the source/drain pattern, an interlayer insulating film which is placed on the substrate, covers side walls of the lower active contact, and includes a trench that exposes the lower active contact, an etching stop film on a bottom surface of the trench and side walls of the trench, a filling insulation film within the trench on the etching stop film, and an upper active contact that extends through the filling insulation film and the etching stop film and is connected to the lower active contact. An uppermost surface of the etching stop film may be coplanar with an upper surface of the upper active contact. A width of the bottom surface of the trench in the first direction may be greater than a width of an upper surface of the lower active contact in the first direction, and a width of the bottom surface of the trench in the second direction may be greater than a width of the upper surface of the lower active contact in the second direction.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Although drawings of a semiconductor device according to some embodiments show a fin type transistor (FinFET) including a channel region of a fin type pattern shape, a transistor including a nanowire or a nanosheet, and a MBCFET (Multi-Bridge Channel Field Effect Transistor) as an example, the embodiments are not limited thereto. The semiconductor device according to some embodiments may include a tunneling transistor (tunneling FET) or a three-dimensional (3D) transistor. The semiconductor device according to some embodiments may include a planar transistor. In addition, the technical idea of the present disclosure may be applied to transistors based on two-dimensional (2D) materials (e.g., 2D-material-based FETs) and a heterostructure thereof.

Further, the semiconductor device according to some embodiments may also include a bipolar junction transistor, a laterally diffused metal oxide semiconductor (LDMOS), or the like.

The semiconductor device according to some embodiments will be described referring to FIGS. 1 to 3.

Figure 1:
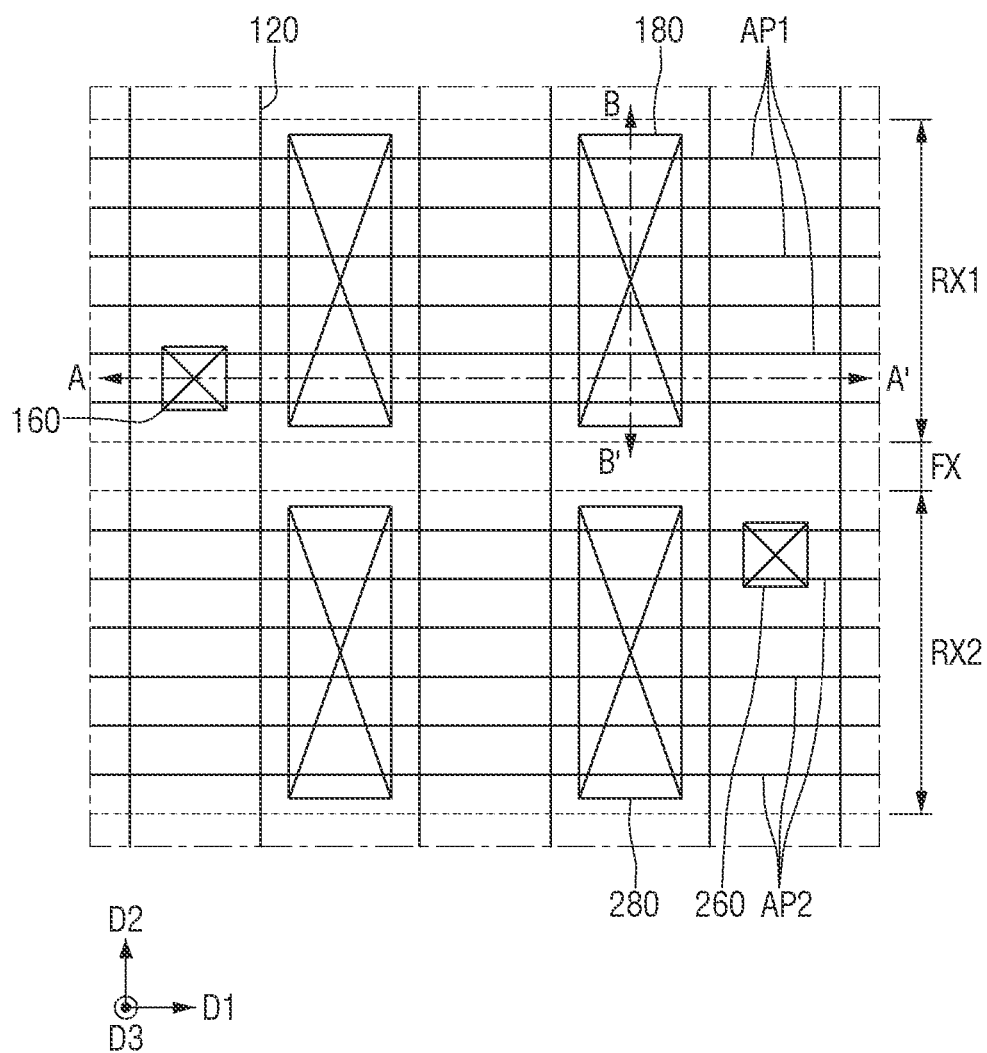
FIG. 1 is a layout diagram for explaining a semiconductor device according to some embodiments.

FIG. 1 is an exemplary layout diagram for explaining a semiconductor device according to some embodiments. FIG. 2 is an exemplary cross-sectional view taken along A-A' of FIG. 1. FIG. 3 is an exemplary cross-sectional view taken along B-B' of FIG. 1.

Figure 2:
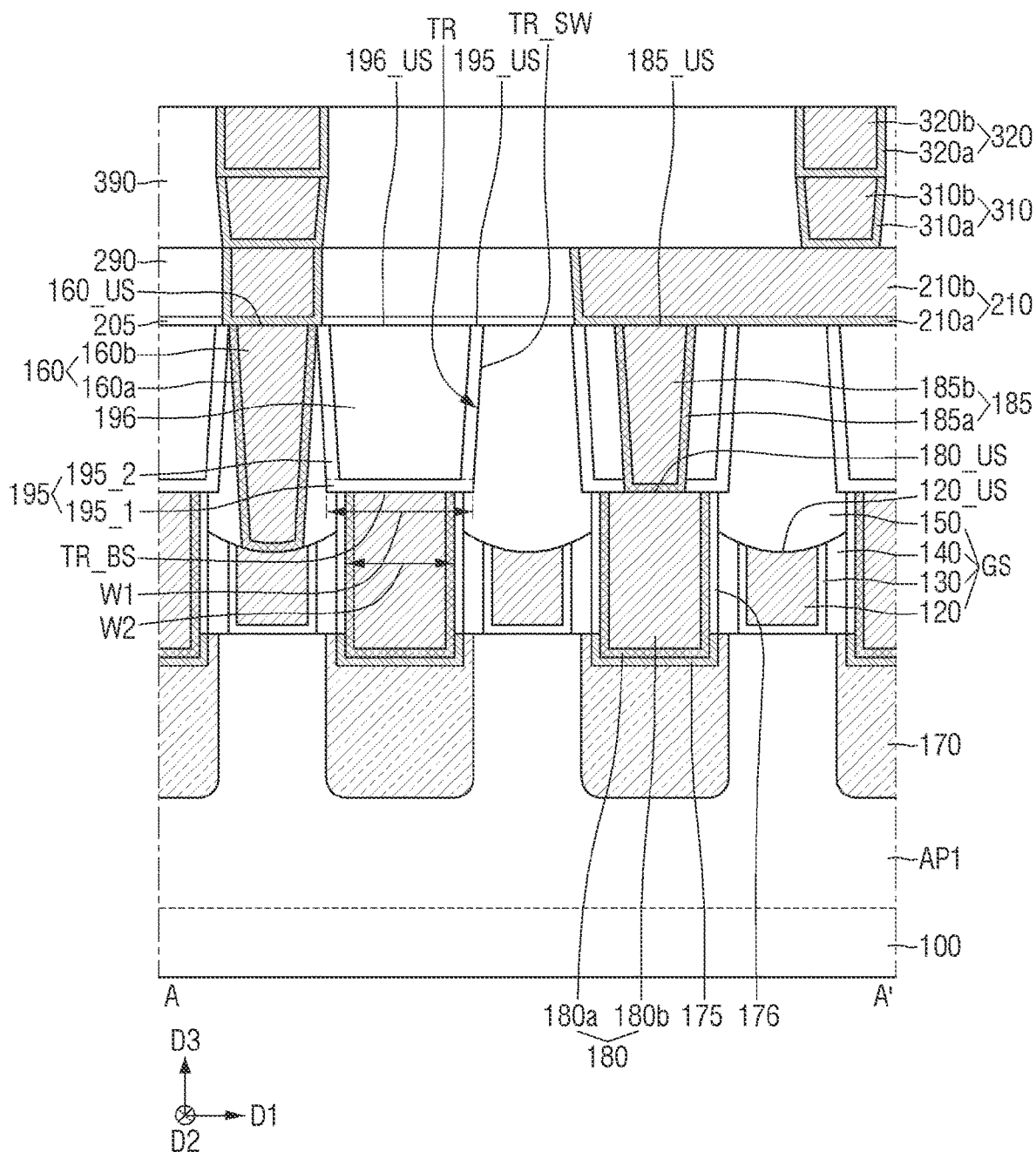
FIG. 2 is a cross-sectional view taken along A-A' of FIG. 1.
Figure 3:
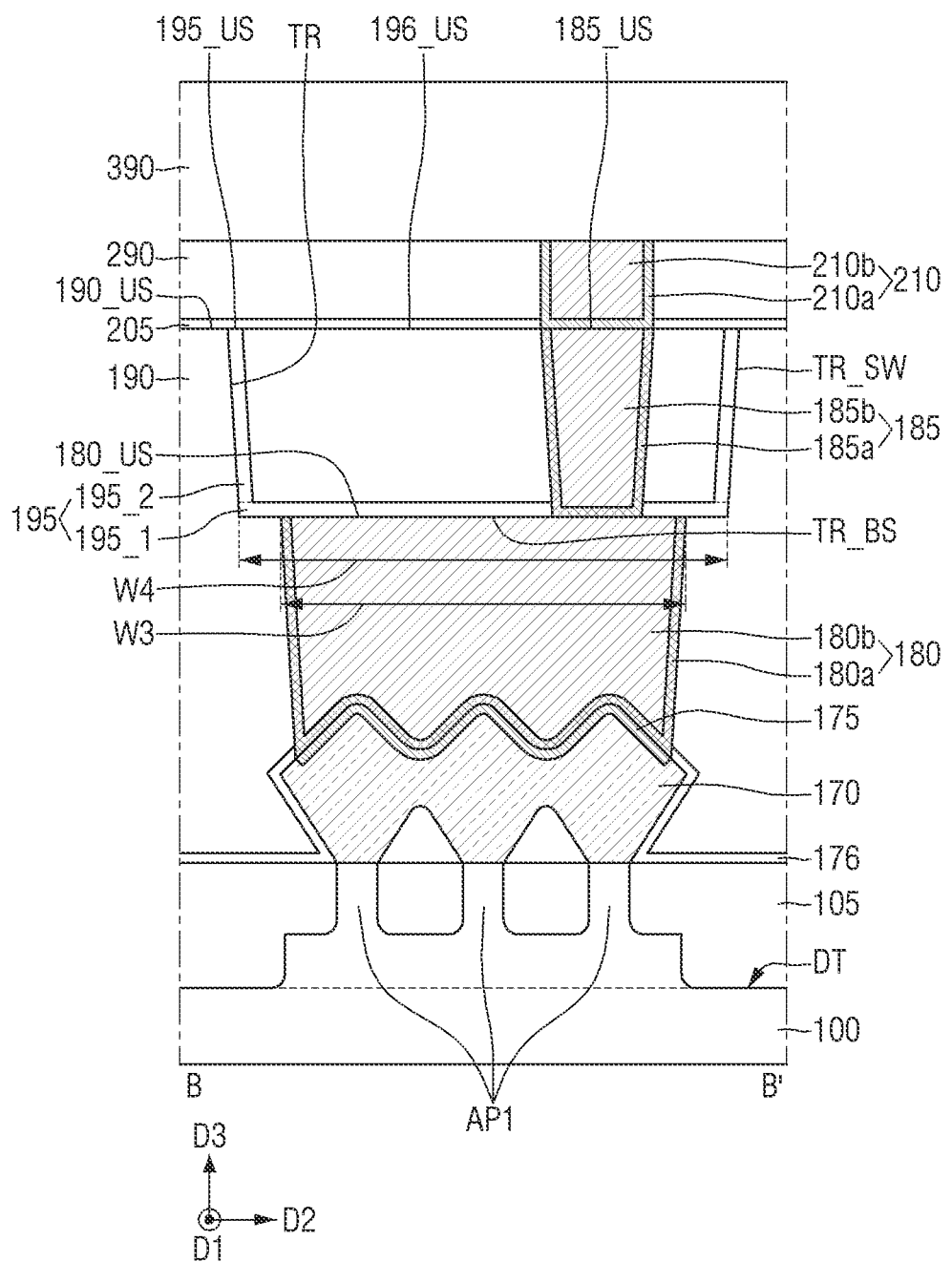
FIG. 3 is a cross-sectional view taken along B-B' of FIG. 1.

Referring to FIGS. 1 to 3, the semiconductor device according to some embodiments may include at least one or more first active patterns AP1, at least one or more second active patterns AP2, a gate electrode 120, a first active contact 180, a second active contact 280, a first gate contact 160, and a second gate contact 260.

The substrate 100 may include a first active region RX1, a second active region RX2, and a field region FX. The field region FX may be formed between the first active region RX1 and the second active region RX2. The field region FX may be formed immediately adjacent to the first active region RX1 and the second active region RX2. The field region FX may form a boundary between the first active region RX1 and the second active region RX2.

The first active region RX1 and the second active region RX2 are spaced apart from each other. The first active region RX1 and the second active region RX2 may be separated by the field region FX.

In some embodiments, an element isolation film may be placed around the first active region RX1 and the second active region RX2 which are spaced apart from each other. A portion of the element isolation film located between the first active region RX1 and the second active region RX2 may be the field region FX or may be in the field region FX. A portion of the semiconductor device in which a channel region of a transistor is formed may be the active region, and a portion of the semiconductor device that divides the channel region of the transistor formed in the active region may be the field region. Alternatively, the active region may be a portion of the semiconductor device in which a fin type pattern or nanosheet used as the channel region of the transistor is formed, and the field region may be a region or portion of the semiconductor device in which the fin type pattern or nanosheet used as the channel region is not formed.

Although the field region FX may be defined by a deep trench DT as shown in FIG. 3, the present disclosure and the embodiments thereof are not limited thereto. In addition, those skilled in the technical field to which the present disclosure belongs may be capable of distinguishing which part is the field region and which part is the active region.

In some embodiments, one of the first active region RX1 and the second active region RX2 may be a PMOS formation region, and the other thereof may be an NMOS formation region. In some embodiments, both the first active region RX1 and the second active region RX2 may be PMOS formation regions. In some embodiments, both the first active region RX1 and the second active region RX2 may be NMOS formation regions.

The substrate 100 may be a silicon substrate or an SOI (silicon-on-insulator). In contrast, the substrate 100 may include, but is not limited to, silicon germanium, SGOI (silicon germanium on insulator), indium antimonide, lead tellurium compounds, indium arsenic, indium phosphide, gallium arsenide or gallium antimonide.

At least one or more first active patterns AP1 may be formed in the first active region RX1. The first active pattern AP1 may protrude from the substrate 100 of the first active region RX1. The first active pattern AP1 may extend in length in a first direction D1 on the substrate 100. For example, the first active pattern AP1 may include a relatively longer side extending in the first direction D1, and a relatively shorter side extending in a second direction D2. Here, the first direction D1 may intersect the second direction D2 and a third direction D3. Also, the second direction D2 may intersect the third direction D3. The first direction D1, the second direction D2, and the third direction D3 may be substantially perpendicular to each other.

At least one or more second active patterns AP2 may be formed on the second active region RX2. Description of the second active pattern AP2 may be substantially the same as the description of the first active pattern AP1.

Each of the first active pattern AP1 and the second active pattern AP2 may be a multi-channel active pattern. In the semiconductor device according to some embodiments, each of the first active patterns AP1 and the second active patterns AP2 may be, for example, a fin type pattern. Each of the first active patterns AP1 and the second active patterns AP2 may be used as a channel pattern of the transistor. Although FIGS. 1-3 illustrate an example having three first active patterns AP1 and three second active patterns AP2, this is merely for convenience of explanation, and the present disclosure is not limited thereto. One or more first active patterns AP1 and second active patterns AP2 may be provided, with differing numbers thereof. Herein, description will provided be of a single first active pattern AP1 and second active pattern AP2, with the understanding that the relevant description thereof is applicable to each first active pattern AP1 and second active pattern AP1 present in the semiconductor device.

Each of the first active pattern AP1 and the second active pattern AP2 may be a part of the substrate 100, and may include an epitaxial layer that is grown from the substrate 100. The first active pattern AP1 and the second active pattern AP2 may include, for example, silicon or germanium, which is an elemental semiconductor material. Further, the first active pattern AP1 and the second active pattern AP2 may include a compound semiconductor, and may include, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge) and tin (Sn), or a compound obtained by doping these elements with a group IV element.

The group III-V compound semiconductor may be, for example, one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

In some embodiments, the first active pattern AP1 and the second active pattern AP2 may include the same material. In some embodiments, the first active pattern AP1 and the second active pattern AP2 may include different materials from each other.

A field insulating film 105 may be formed on the substrate 100. The field insulating film 105 may be formed over the first active region RX1, the second active region RX2, and the field region FX.

The field insulating film 105 may be formed on a part of the side wall of the first active pattern AP1 and a part of the side wall of the second active pattern AP2. Each of the first active pattern AP1 and the second active pattern AP2 may protrude upward from the upper surface of the field insulating film 105. The field insulating film 105 may include, for example, an oxide film, a nitride film, an oxynitride film or a combination film thereof.

A plurality of gate structures GS may be placed on the substrate 100. At least one or more gate structures GS may extend in the second direction D2. The plurality of gate structures GS may be on or above the field insulating film 105. Each of the gate structures GS may be spaced apart from each other in the first direction D1.

The gate structure GS may be on the first active pattern AP1 and the second active pattern AP2. The gate structure GS may intersect or cross the first active pattern AP1 and the second active pattern AP2.

Although the gate structure GS is shown as being over the first active region RX1 and the second active region RX2, this is merely for convenience of explanation, and the embodiment is not limited thereto. That is, the gate structure GS or a portion thereof may be divided into first and second parts by a gate separation structure on the field insulating film 105, and the first and second parts may be respectively on the first active region RX1 and the second active region RX2.

The gate structure GS may include, for example, a gate electrode 120, a gate insulating film 130, a gate spacer 140, and a gate capping pattern 150.

The gate electrode 120 may be formed on the first active pattern AP1 and the second active pattern AP2. The gate electrode 120 may intersect or cross the first active pattern AP1 and the second active pattern AP2. The gate electrode 120 may include a relatively longer side extending in the second direction D2 and a relatively shorter side extending in the first direction D1.

An upper surface 120_US of the gate electrode may be, but is not limited to, a concave curved surface that is recessed toward the upper surface of the first active pattern AP1. In some embodiments, unlike the configuration in FIGS. 1-3, the upper surface 120_US of the gate electrode may be a flat surface.

The gate electrode 120 may include, but is not limited to, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC-N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and/or combinations thereof.

The gate electrode 120 may include conductive metal oxides, conductive metal oxynitrides, or the like. The gate electrode 120 may also include oxidized forms of the aforementioned materials.

The gate spacer 140 may be on the side wall of the gate electrode 120. The gate spacer 140 may extend in the second direction D2. The gate spacer 140 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and/or combinations thereof.

The gate insulating film 130 may extend along a side wall and a bottom surface of the gate electrode 120. The gate insulating film 130 may be formed on the first active pattern AP1, the second active pattern AP2 and the field insulating film 105. The gate insulating film 130 may be formed between the gate electrode 120 and the gate spacer 140.

Although it is not shown, the gate insulating film 130 may be formed along the profile or side walls of the first active pattern AP1 that protrude above the field insulating film 105, and the upper surface of the field insulating film 105. Although it is not shown, an interface film may be further formed along the profile or side walls of the first active pattern AP1 that protrude above the field insulating film 105. Each gate insulating film 130 may be formed on the interface film. Although it is not shown, the gate insulating film 130 (and in some embodiments an interface film) may be formed along the profile or side walls of the second active pattern AP2 that protrude above the field insulating film 105.

The gate insulating film 130 may include silicon oxide, silicon oxynitride, silicon nitride, and/or a high dielectric constant material having a higher dielectric constant than that of silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and/or lead zinc niobate.

The semiconductor device according to some embodiments may include an NC (Negative Capacitance) FET that uses a negative capacitor. For example, the gate insulating film 130 may include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. On the other hand, if at least one of the capacitances of two or more capacitors connected in series has a negative value, the overall capacitances may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) below 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and/or lead zirconium titanium oxide. In some embodiments, the hafnium zirconium oxide may be a material obtained by doping hafnium oxide with zirconium (Zr). In some embodiments, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and/or yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include at least one of, for example, a silicon oxide and/or a metal oxide having a high dielectric constant. The metal oxide included in the paraelectric material film may include, for example, but is not limited to, at least one of hafnium oxide, zirconium oxide, and/or aluminum oxide.

The ferroelectric material film and the paraelectric material film may include the same material. The ferroelectric material film may have ferroelectric properties, but the paraelectric material film may not have ferroelectric properties. For example, when the ferroelectric material film and the paraelectric material film include hafnium oxide, a crystal structure of hafnium oxide included in the ferroelectric material film may differ from a crystal structure of hafnium oxide included in the paraelectric material film.

The ferroelectric material film may have a thickness having the ferroelectric properties. A thickness of the ferroelectric material film may be, for example, but is not limited to, 0.5 to 10 nanometers (nm). Since a critical thickness for exhibiting ferroelectric properties may vary for each ferroelectric material, the thickness of the ferroelectric material film may vary depending on the ferroelectric material.

In some embodiments, the gate insulating film 130 may include one ferroelectric material film. In some embodiments, the gate insulating film 130 may include a plurality of ferroelectric material films spaced apart from each other. The gate insulating film 130 may have a stacked film structure in which a plurality of ferroelectric material films and a plurality of paraelectric material films are alternately stacked.

The gate capping pattern 150 may be on the upper surface 120_US of the gate electrode and the upper surface of the gate spacer 140. The gate capping pattern 150 may include, for example, at least one of silicon nitride (SiN), silicon oxynitride (SiON), silicon oxide ($SiO_2$), silicon carbonitride (SiCN), silicon oxycarbonitride (SiOCN), and/or combinations thereof.

In some embodiments, and in contrast to the shown configuration in FIGS. 1-3, the gate capping pattern 150 may be between the gate spacers 140. In such cases, an upper surface of the gate capping pattern 150 may be on a same plane as (or coplanar with) the upper surface of the gate spacer 140. The upper surface of the gate capping pattern 150 may be an upper surface of the gate structure GS.

A source/drain pattern 170 may be formed on the first active pattern AP1. The source/drain pattern 170 may be formed on the substrate 100. The source/drain pattern 170 may be on the side surface of the gate structure GS. The source/drain pattern 170 may be between adjacent gate structures GS.

In some embodiments, the source/drain pattern 170 may be on either side of the gate structure GS. In some embodiments, and in contrast to the shown configuration in FIGS. 1-3, the source/drain pattern 170 may be on one side of the gate structure GS and may be absent from the other side of the gate structure GS. The upper surface of the source/drain pattern 170 may be a flat surface. However, the present disclosure is not limited thereto.

The source/drain pattern 170 may include an epitaxial pattern. The source/drain pattern 170 may be included in a source/drain region of a transistor that uses the first active pattern AP1 as a channel region.

Although it is not shown, a source/drain pattern as explained above may be placed on the second active pattern AP2 between the gate structures GS.

In some embodiments, a protective film 176 may be on the upper surface of the field insulating film 105, the side walls of the gate structure GS, and the side walls of the source/drain pattern 170. The protective film 176 may extend to a bottom surface TR_BS of a trench TR to be described below. The protective film 176 may extend from the upper surface of the source/drain pattern 170 to the bottom surface TR_BS of the trench TR along the side walls of the gate structure GS.

In some embodiments, and in contrast to the shown configuration in FIGS. 1-3, the protective film 176 may not be formed. In this case, the lower active contact 180 may be in contact with the side wall of the gate structure GS. However, the present disclosure is not limited thereto. Even if the protective film 176 is not formed, the lower active contact 180 may not be in contact with the side wall of the gate structure GS. For example, the side wall of the lower active contact 180 may be surrounded by a first interlayer insulating film 190 to be described below.

The protective film 176 may include a material having an etching selectivity to the first interlayer insulating film 190. The protective film 176 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and/or combinations thereof.

First active contacts 180 and 185 may be placed on the first active region RX1. A second active contact 280 may be placed on the second active region RX2.

The first active contacts 180 and 185 may be connected to the source/drain pattern 170 formed in the first active region RX1. Although it is not shown, the second active contact 280 may be connected to the source/drain region formed in the second active region RX2. Since the second active contact 280 may be substantially the same as the first active contacts 180 and 185, only the first active contacts 180 and 185 will be described below.

The first active contacts 180 and 185 may include a lower active contact 180 and an upper active contact 185.

The lower active contact 180 may be formed on the source/drain pattern 170. The lower active contact 180 may be connected to the source/drain pattern 170. Although the lower active contact 180 is shown as being in contact with the protective film 176, the present disclosure is not limited thereto.

In some embodiments, an upper surface 180_US of the lower active contact 180 may be higher than the upper surface 120_US of the gate electrode 120 measured from the upper surface of the substrate 100. That is, a height from the upper surface of the substrate 100 to the upper surface 180_US of the lower active contact 180 may be greater than a height from the upper surface of the substrate 100 to the upper surface 120_US of the gate electrode 120.

A silicide film 175 may be formed between the lower active contact 180 and the source/drain pattern 170. Although the silicide film 175 is shown as being formed along a profile of an interface surface between the source/drain pattern 170 and the lower active contact 180, the present disclosure is not limited thereto. The silicide film 175 may include, for example, a metal silicide material.

The lower active contact 180 may be formed of a multi-film. The lower active contact 180 may include, for example, a lower active contact barrier film 180a and a lower active contact filling film 180b. The lower active contact filling film 180b may be placed on the lower active contact barrier film 180a. The lower active contact barrier film 180a may extend along the side walls and bottom surface of the lower active contact filling film 180b.

The lower active contact barrier film 180a may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and/or a two-dimensional (2D) material. In the semiconductor device according to some embodiments, the two-dimensional material may be a metallic material and/or a semiconductor material. The 2D material may include a 2D allotrope or a 2D compound, and may include, but is not limited to, at least one of graphene, molybdenum disulfide ($MoS_2$), molybdenum diselenide ($MoSe_2$), tungsten diselenide ($WSe_2$), and tungsten disulfide ($WS_2$). That is, since the above-mentioned 2D materials are only listed by way of example, the 2D materials that may be included in the semiconductor device of the present disclosure are not limited by or to the above-mentioned materials.

The lower active contact filling film 180b may include, for example, at least one of aluminum (Al), tungsten (W), cobalt (Co), ruthenium (Ru), silver (Ag), gold (Au), manganese (Mn), and/or molybdenum (Mo).

The semiconductor device according to some embodiments may include a trench TR on the lower active contact 180 that exposes the lower active contact 180 (or the upper surface 180_US thereof). Side walls TR_SW of the trench TR may overlap the gate capping pattern 150 in a first direction D1 and a third direction D3. The side walls TR_SW of the trench TR may overlap the gate spacer 140 in the third direction D3. The side walls TR_SW of the trench TR may not overlap the gate electrode 120 in the third direction D3.

A bottom surface TR_BS of the trench TR may be located on the same plane as (or coplanar with) the upper surface 180_US of the lower active contact 180. A height from the upper surface of the substrate 100 to the bottom surface TR_BS of the trench TR may be the same as or equal to the height from the upper surface of the substrate 100 to the upper surface 180_US of the lower active contact 180.

The bottom surface TR_BS of the trench TR may overlap the gate capping pattern 150 in the third direction D3. The bottom surface TR_BS of the trench TR may overlap the gate spacer 140 in the third direction D3. The bottom surface TR_BS of the trench TR may not overlap the gate electrode 120 in the third direction D3. Although the trench TR is shown as having an increasing width in the first direction D1 and the second direction D2 as a distance from the substrate 100 toward the upper part of the trench TR increases, the present disclosure is not limited thereto.

In FIG. 2, a width W1 of the bottom surface TR_BS of the trench TR in the first direction D1 is greater than a width W2 of the upper surface 180_US of the lower active contact 180 in the first direction D1. At a boundary between the trench TR and the lower active contact 180, the width of the trench TR in the first direction D1 is greater than the width of the lower active contact 180 in the first direction D1. That is, the width of the trench TR in the first direction D1 may be greater than the width of the lower active contact 180 in the first direction D1.

In FIG. 3, a width W4 of the bottom surface TR_BS of the trench TR in the second direction D2 is greater than a width W3 of the upper surface 180_US of the lower active contact 180 in the second direction D2. At the boundary between the trench TR and the lower active contact 180, the width of the trench TR in the second direction D2 is greater than the width of the lower active contact 180 in the second direction D2. That is, the width of the trench TR in the second direction D2 may be greater than the width of the lower active contact 180 in the second direction D2.

The side walls TR_SW of the trench TR and the side walls of the lower active contact 180 may not be formed continuously, and may be discontinuous from each other. That is to say, at the boundary between the trench TR and the lower active contact 180, the width of the trench TR is greater than the width of the lower active contact 180. At the boundary between the bottom surface TR_BS of the trench TR and the upper surface 180_US of the lower active contact 180, the bottom surface TR_BS of the trench TR has a width in the first direction D1 and the second direction D2 greater than the upper surface 180_US of the lower active contact 180.

An etching stop film 195 may be along the bottom surface TR_BS and the side walls TR_SW of the trench TR. The etching stop film 195 may have, but is not limited to, a 'U' shape.

The etching stop film 195 may have a first portion 195_1 along the bottom surface TR_BS of the trench TR, and a second portion 195_2 along the side walls TR_SW of the trench TR on the first portion 195_1.

The second portion 195_2 of the etching stop film 195 may extend to the upper surface of the gate capping pattern 150. The second portion 195_2 of the etching stop film 195 may extend to an upper surface 190_US of the first interlayer insulating film 190. An uppermost surface 195_US of the etching stop film 195 may be located on the same plane as (or coplanar with) the upper surface of the gate capping pattern 150 and the upper surface 190_US of the first interlayer insulating film 190.

A width of the first portion 195_1 of the etching stop film 195 in the first direction D1 may be the same as the width W1 of the bottom surface TR_BS of the trench TR in the first direction D1. A width of the first portion 195_1 of the etching stop film 195 in the second direction D2 may be the same as the width W4 of the bottom surface TR_BS of the trench TR in the second direction D2.

That is, the width of the first portion 195_1 of the etching stop film 195 in the first direction D1 may be greater than the width W2 of the upper surface 180_US of the lower active contact 180 in the first direction D1. The width of the first portion 195_1 of the etching stop film 195 in the second direction D2 may be greater than the width W3 of the upper surface 180_US of the lower active contact 180 in the second direction D2.

In some embodiments, the etching stop film 195 may include a material having an etching selectivity to a filling insulation film 196 to be described below. The etching stop film 195 may include, but is not limited to, at least one of, for example, aluminum oxide (AlO) and/or aluminum nitride (AlN).

The filling insulation film 196 may be formed on the etching stop film 195. The filling insulation film 196 may fill the remaining portion of the trench TR after the formation of the etching stop film 195. An upper surface 196_US of the filling insulation film 196 may be located on the same plane as (or coplanar with) an uppermost surface 195_US of the etching stop film 195. The upper surface 196_US of the filling insulation film 196 may be located on the same plane as (or coplanar with) the upper surface 190_US of the first interlayer insulating film 190 and the upper surface of the gate capping pattern 150.

In some embodiments, the filling insulation film 196 may include a material having an etching selectivity to the etching stop film 195. The filling insulation film 196 may include, but is not limited to, at least one of, for example, silicon nitride (SiN), silicon oxycarbide (SiOC), and silicon oxide (SiO).

The upper active contact 185 may be formed on the lower active contact 180. The upper active contact 185 may be connected to the lower active contact 180. The upper active contact 185 may penetrate or extend through the filling insulation film 196 and the etching stop film 195 in the third direction D3.

An upper surface 185_US of the upper active contact 185 may be located on the same plane as (or coplanar with) the uppermost surface 195_US of the etching stop film 195. The upper surface 185_US of the upper active contact 185 may be located on the same plane as (or coplanar with) the upper surface 196_US of the filling insulation film 196. The upper surface 185_US of the upper active contact 185 may be located on the same plane as (or coplanar with) the upper surface 190_US of the first interlayer insulating film 190. The upper surface 185_US of the upper active contact 185 may be located on the same plane as (or coplanar with) the upper surface 160_US of the first gate contact 160. The upper surface 185_US of the upper active contact 185 may be located on the same plane as (or coplanar with) the upper surface of the gate capping pattern 150.

In some embodiments, the upper active contact 185 may not be in contact with the second portion 195_2 of the etching stop film 195. The filling insulation film 196 may be between the upper active contact 185 and the second portion 195_2 of the etching stop film 195. The upper active contact 185 and the second portion 195_2 of the etching stop film 195 may be spaced apart from each other in the first direction D1. The second portions 195_2 of the etching stop film 195 may be spaced apart from each other in the second direction D2. However, the present disclosure is not limited thereto.

The upper active contact 185 may be formed of a multi-film. The upper active contact 185 may include, for example, an upper active contact barrier film 185a and an upper active contact filling film 185b. The upper active contact filling film 185b may be on the upper active contact barrier film 185a. The upper active contact barrier film 185a may be along the bottom surface and side walls of the upper active contact filling film 185b.

Contents of the materials included in the upper active contact barrier film 185a and the upper active contact filling film 185b may each be the same as the materials included in the lower active contact barrier film 180a and the lower active contact filling film 180b, and reference is made to the discussion thereof in the interest of brevity.

The first gate contact 160 may be on the first active region RX1. The second gate contact 260 may be on the second active region RX2. Since the first gate contact 160 and the second gate contact 260 may be substantially the same, only the first gate contact 160 will be described below in the interest of brevity.

The first gate contact 160 may be on the gate electrode 120. The first gate contact 160 may be connected to the gate electrode 120 included in the gate structure GS. The first gate contact 160 may penetrate or extend through the gate capping pattern 150 in the third direction D3.

The first gate contact 160 may be at a position where it overlaps the gate structure GS. In some embodiments, at least a part of the first gate contact 160 may be at a position where it overlaps the first active pattern AP1. The upper surface 160_US of the first gate contact 160 may be located on the same plane as (or coplanar with) the upper surface of the gate capping pattern 150. The upper surface 160_US of the first gate contact may be located on the same plane as (or coplanar with) the uppermost surface 195_US of the etching stop film 195, the upper surface 196_US of the filling insulation film 196, and the upper surface 185_US of the upper active contact 185.

The width of the upper surface 160_US of the first gate contact 160 in the first direction D1 may be the same as or equal to a width between the uppermost surfaces 195_US of the adjacent etching stop films 195 in the first direction D1.

In the semiconductor device according to some embodiments, at least a part of the first gate contact 160 may be at a position where it overlaps at least one of the first active region RX1 and the second active region RX2. For example, the first gate contact 160 may be entirely arranged on the first active region RX1 and the second active region RX2.

The first gate contact 160 may be formed of a multi-film. The first gate contact 160 may include, for example, a gate contact barrier film 160a and a gate contact filling film 160b. The gate contact filling film 160b may be on the gate contact barrier film 160a. The gate contact barrier film 160a may be along the side walls and bottom surface of the gate contact filling film 160b.

Contents of the materials included in the gate contact barrier film 160a and the gate contact filling film 160b may each be the same as the description of the materials included in the lower active contact barrier film 180a and the lower active contact filling film 180b, and reference is made to the discussion thereof in the interest of brevity.

The first interlayer insulating film 190 may be on the field insulating film 105. The first interlayer insulating film 190 may include the trench TR that exposes the lower active contact 180. The first interlayer insulating film 190 may cover the side walls of the lower active contact 180. The first interlayer insulating film 190 may cover the side walls of the source/drain pattern 170.

The upper surface 190_US of the first interlayer insulating film 190 may be located on the same plane as (or coplanar with) the upper surface 196_US of the filling insulation film 196, the upper surface 185_US of the upper active contact 185, and the uppermost surface 195_US of the etching stop film 195.

The first interlayer insulating film 190 may include, for example, at least one of silicon oxide, silicon nitride, silicon oxynitride and/or a low dielectric constant material. The low dielectric constant material may include, but is not limited to, for example, at least one of Fluorinated TetraEthylOrthoSilicate (FTEOS), Hydrogen SilsesQuioxane (HSQ), BisbenzoCycloButene (BCB), TetraMethylOrthoSilicate (TMOS), OctaMethylCycloTetraSiloxane (OMCTS), HexaMethylDiSiloxane (HMDS), TriMethylSilyl Borate (TMSB), DiAcetoxyDitertiaryButoSiloxane (DADBS), TriMethylSilyl Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica and/or combinations thereof.

In some embodiments, a second interlayer insulating film 290 and a third interlayer insulating film 390 may be formed on the first interlayer insulating film 190.

Each of the second interlayer insulating film 290 and the third interlayer insulating film 390 may include, for example, at least one of silicon oxide, silicon nitride, silicon oxynitride and/or a low dielectric constant material.

In some embodiments, a wiring etching stop film 205 may extend along the upper surface of the gate capping pattern 150 and the upper surface 190_US of the first interlayer insulating film 190. The wiring etching stop film 205 may extend along the uppermost surface 195_US of the etching stop film 195 and the upper surface 196_US of the filling insulation film 196. The second interlayer insulating film 290 may be placed on the wiring etching stop film 205. The wiring etching stop film 205 may include a material having an etching selectivity to the second interlayer insulating film 290. The wiring etching stop film 205 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), aluminum oxide (AlO), aluminum nitride (AlN), aluminum oxycarbide (AlOC), and/or combinations thereof.

The first wiring pattern 210 may be placed on the first gate contact 160 and the upper active contact 185. The first wiring pattern 210 may be connected to the first gate contact 160. The first wiring pattern 210 may be connected to the upper active contact 185. The first wiring pattern 210 may be formed to penetrate and/or extend through the wiring etching stop film 205.

The first wiring pattern 210 may be inside the second interlayer insulating film 290. The first wiring pattern 210 may include a portion that is in direct contact with the gate capping pattern 150. The first wiring pattern 210 may have a multi-conductive film structure. The first wiring pattern 210 may include, for example, a first wiring barrier film 210a and a first wiring filling film 210b. The first wiring filling film 210b may be on the first wiring barrier film 210a. The first wiring barrier film 210a may be along the side walls and bottom surface of the first wiring filling film 210b.

The first wiring barrier film 210a may include, for example, at least one of tantalum (Ta), tantalum nitride (TaN), titanium (Ti), titanium nitride (TiN), titanium silicon nitride (TiSiN), nickel (Ni), nickel boron (NiB), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and/or a two-dimensional (2D) material.

The first wiring filling film 210b may include, for example, at least one of aluminum (Al), copper (Cu), tungsten (W), cobalt (Co), ruthenium (Ru), silver (Ag), gold (Au), manganese (Mn), and/or molybdenum (Mo).

In some embodiments, a via structure 310 and a second wiring pattern 320 may be included on the first wiring pattern 210. The via structure 310 and the second wiring pattern 320 may be inside the third interlayer insulating film 390.

The via structure 310 may be formed on the first wiring pattern 210. The via structure 310 may be connected to the first wiring pattern 210. The via structure 310 may be a multi-film that includes a via barrier film 310a and a via filling film 310b. The via filling film 310b may be placed on the via barrier film 310a. The via barrier film 310a may be placed along the side walls and bottom surface of the via filling film 310b.

The via barrier film 310a may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and/or two-dimensional (2D) material.

The via filling film 310*b* may include, for example, at least one of aluminum (Al), copper (Cu), tungsten (W), cobalt (Co), ruthenium (Ru), silver (Ag), gold (Au), manganese (Mn), and/or molybdenum (Mo).

The second wiring pattern 320 may be on the via structure 310. The second wiring pattern 320 may be a multi-film that includes a second wiring barrier film 320*a* and a second wiring filling film 320*b*.

The second wiring filling film 320*b* may be on the second wiring barrier film 320*a*. The second wiring barrier film 320*a* may be along the side walls and bottom surface of the second wiring filling film 320*b*. Contents of the materials included in the second wiring barrier film 320*a* and the second wiring filling film 320*b* may be the same as the description of the materials included in the first wiring barrier film 210*a* and the first wiring filling film 310*b*, and reference is made to the discussion thereof in the interest of brevity.

Figure 4:
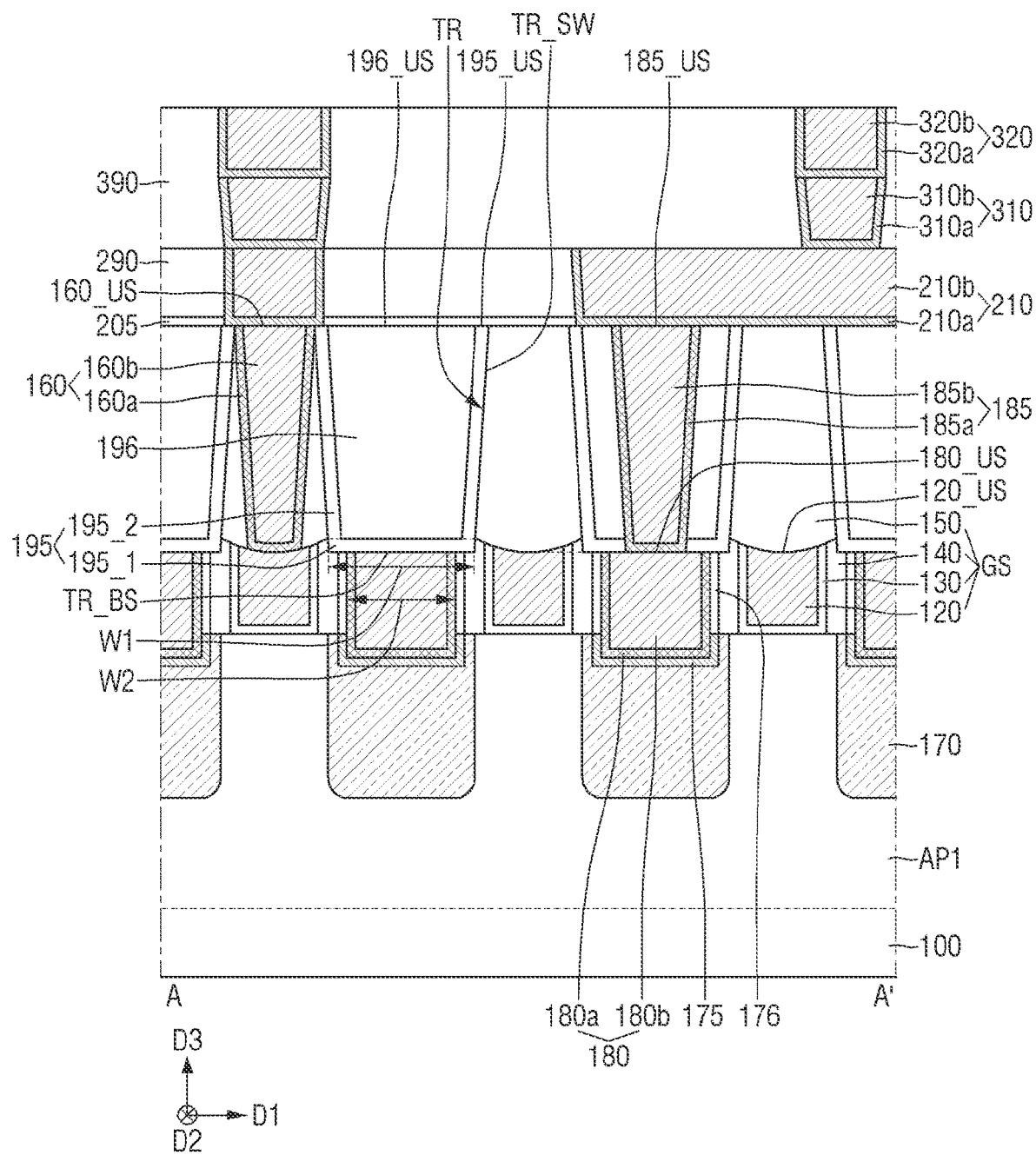
FIG. 4 is a diagram for explaining a semiconductor device according to some embodiments.

FIG. 4 is a diagram for explaining a semiconductor device according to some embodiments. For convenience of explanation, only differences from those described using FIGS. 1 to 3 will be mainly described. For reference, FIG. 4 may be a cross-sectional view taken along A-A' of FIG. 1.

Referring to FIG. 4, the upper surface 180_US of the lower active contact 180 may be located on the same plane as (or coplanar with) a portion of the upper surface 120_US of the gate electrode 120.

A height from the upper surface of the substrate 100 to the upper surface 180_US of the lower active contact 180 may be the same as or equal to a height from the upper surface of the substrate 100 to the upper surface 120_US of the gate electrode 120.

The bottom surface TR_BS of the trench TR may be located on the same plane as (or coplanar with) a portion of the upper surface 120_US of the gate electrode 120. The height from the upper surface of the substrate 100 to the bottom surface TR_BS of the trench TR may be the same as the height from the upper surface of the substrate 100 to a portion of the upper surface 120_US of the gate electrode 120. In some embodiments, where the upper surface 120_US of the gate electrode 120 is a concave curved surface, the portion of the upper surface 120_US of the gate electrode 120 that is coplanar with the bottom surface TR_BS may be a lowest part of the upper surface (that is, the portion of the upper surface 120_US that is closest to the substrate 100).

At least a part of the side wall TR_SW of the trench TR may overlap the gate spacer 140 in the first direction D1 and the third direction D3. At least a part of the bottom surface TR_BS of the trench TR may overlap the gate spacer 140 in the first direction D1 and the third direction D3. The side wall TR_SW of the trench TR may be spaced apart from the gate electrode 120. The bottom surface TR_BS of the trench TR may be spaced apart inside the gate electrode 120.

Figure 5:
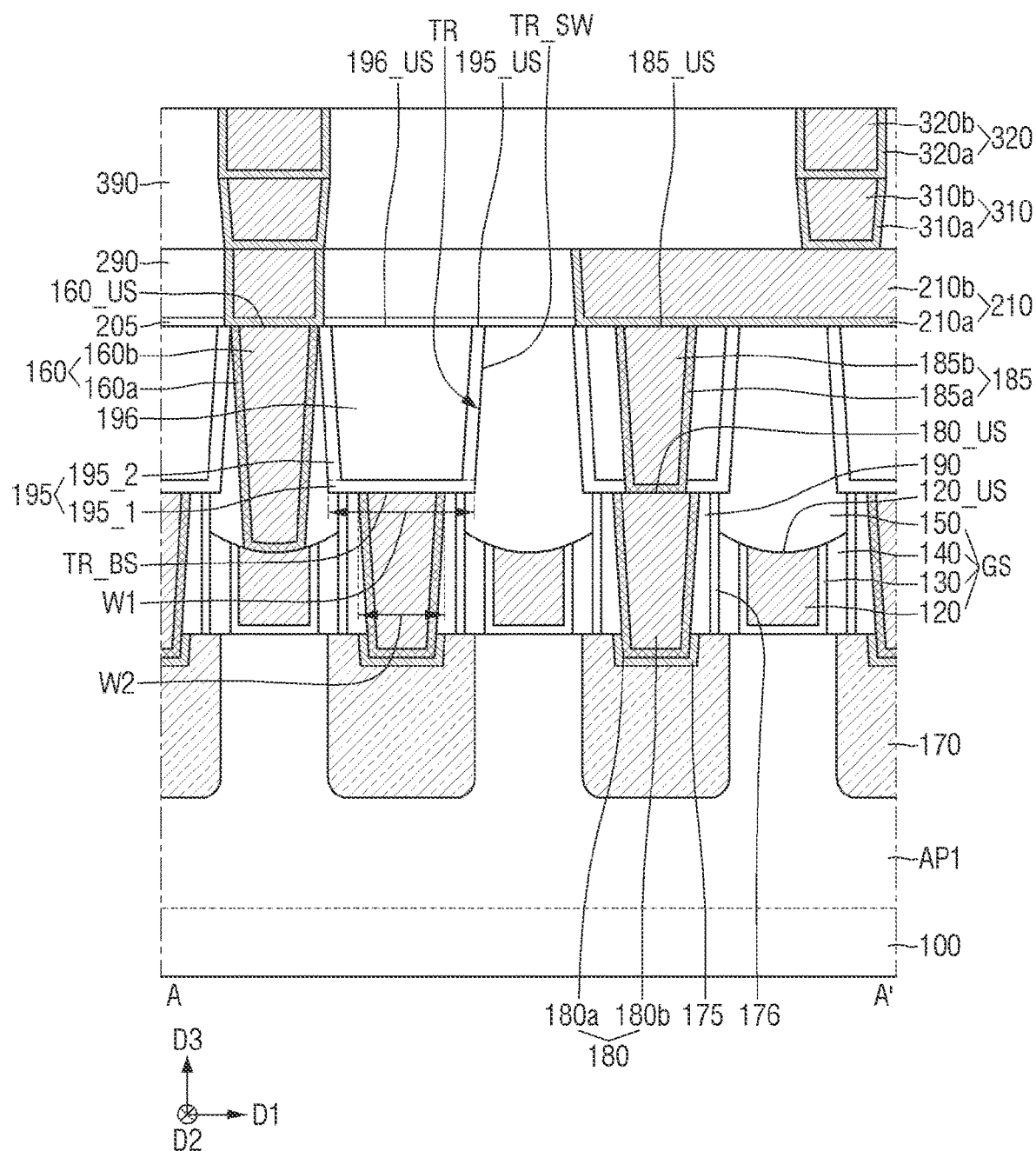
FIG. 5 is a diagram for explaining a semiconductor device according to some embodiments.

FIG. 5 is a diagram for explaining a semiconductor device according to some embodiments. For convenience of explanation, only differences from those described using FIGS. 1 to 3 will be mainly described. For reference, FIG. 5 may be a cross-sectional view taken along A-A' of FIG. 1.

Referring to FIG. 5, at least a part of the lower active contact 180 may not be in contact with the protective film 176.

The side walls of the lower active contact 180 may be surrounded by the first interlayer insulating film 190. The first interlayer insulating film 190 may cover one side wall of the lower active contact 180. Although the lower active contact 180 is shown as having a width in the first direction D1 that decreases from the upper surface 180_US of the lower active contact 180 toward the substrate 100, the present disclosure is not limited thereto.

Figure 6:
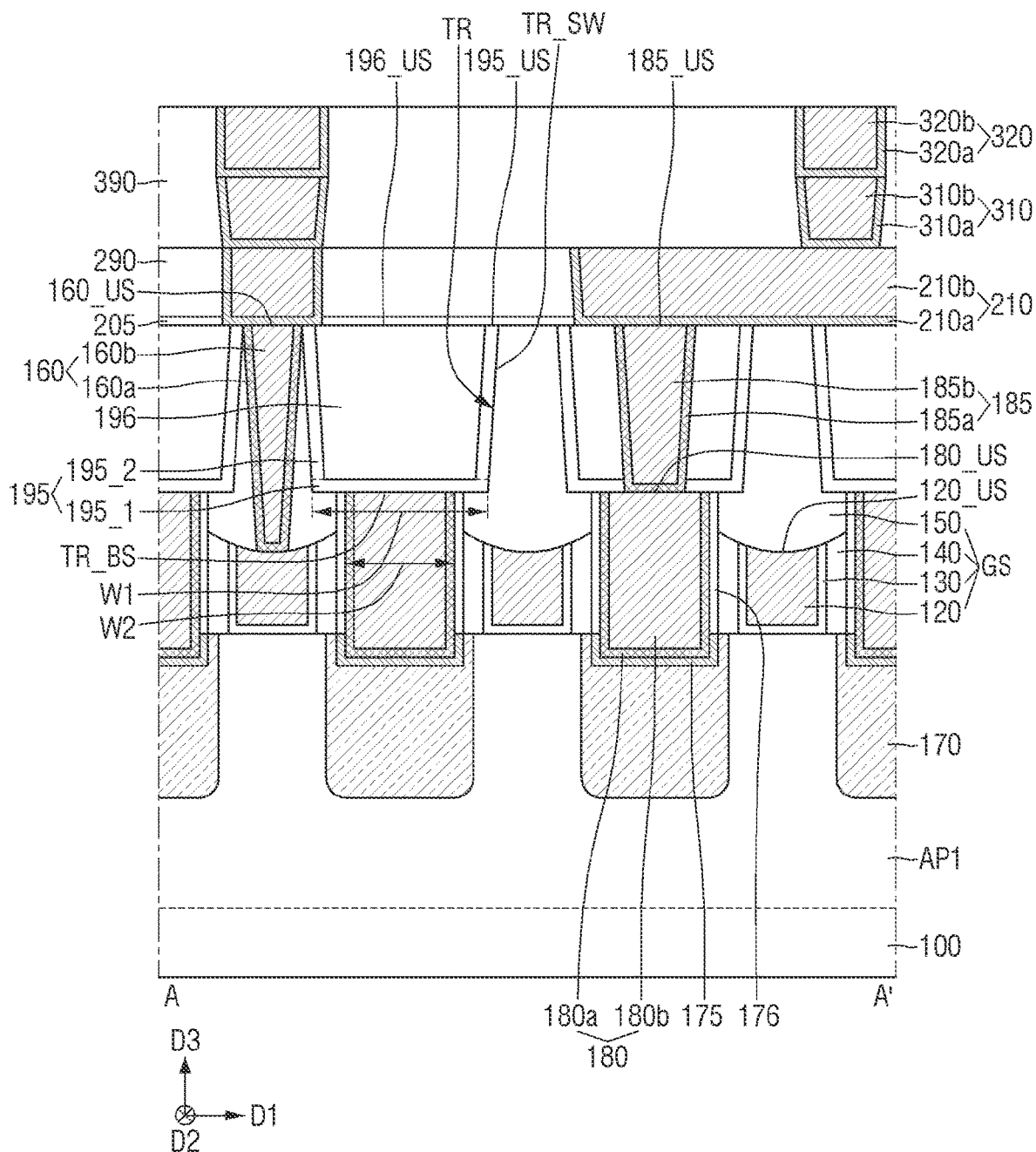
FIG. 6 is a diagram for explaining a semiconductor device according to some embodiments.

FIG. 6 is a diagram for explaining a semiconductor device according to some embodiments. For convenience of explanation, only differences from those described using FIGS. 1 to 3 will be mainly described. For reference, FIG. 6 may be a cross-sectional view taken along A-A' of FIG. 1.

Referring to FIG. 6, at least a part of the side walls TR_SW of the trench TR may overlap the gate electrode 120 in the third direction D3.

A width of the bottom surface TR_BS of the trench TR in the first direction D1 may increase. The width in the first direction D1 between side walls TR_SW of first and second adjacent trenches TR may decrease. The width of the first gate contact 160 in the first direction D1 may decrease. Since the first gate contact 160 is formed by utilizing the etching stop film 195 as a mask, the width in the first direction D1 of the upper surface 160_US of the first gate contact 160 may be determined based on the width in the first direction D1 of the uppermost surface 195_US of the etching stop film 195 between the adjacent trenches TR.

In some embodiments, the second portion 195_2 of the etching stop film 195 may overlap the gate electrode 120 in the third direction D3.

In some embodiments, the second portion 195_2 of the etching stop film 195 may not overlap the lower active contact 180 in the third direction D3. However, the present disclosure is not limited thereto.

Figure 7:
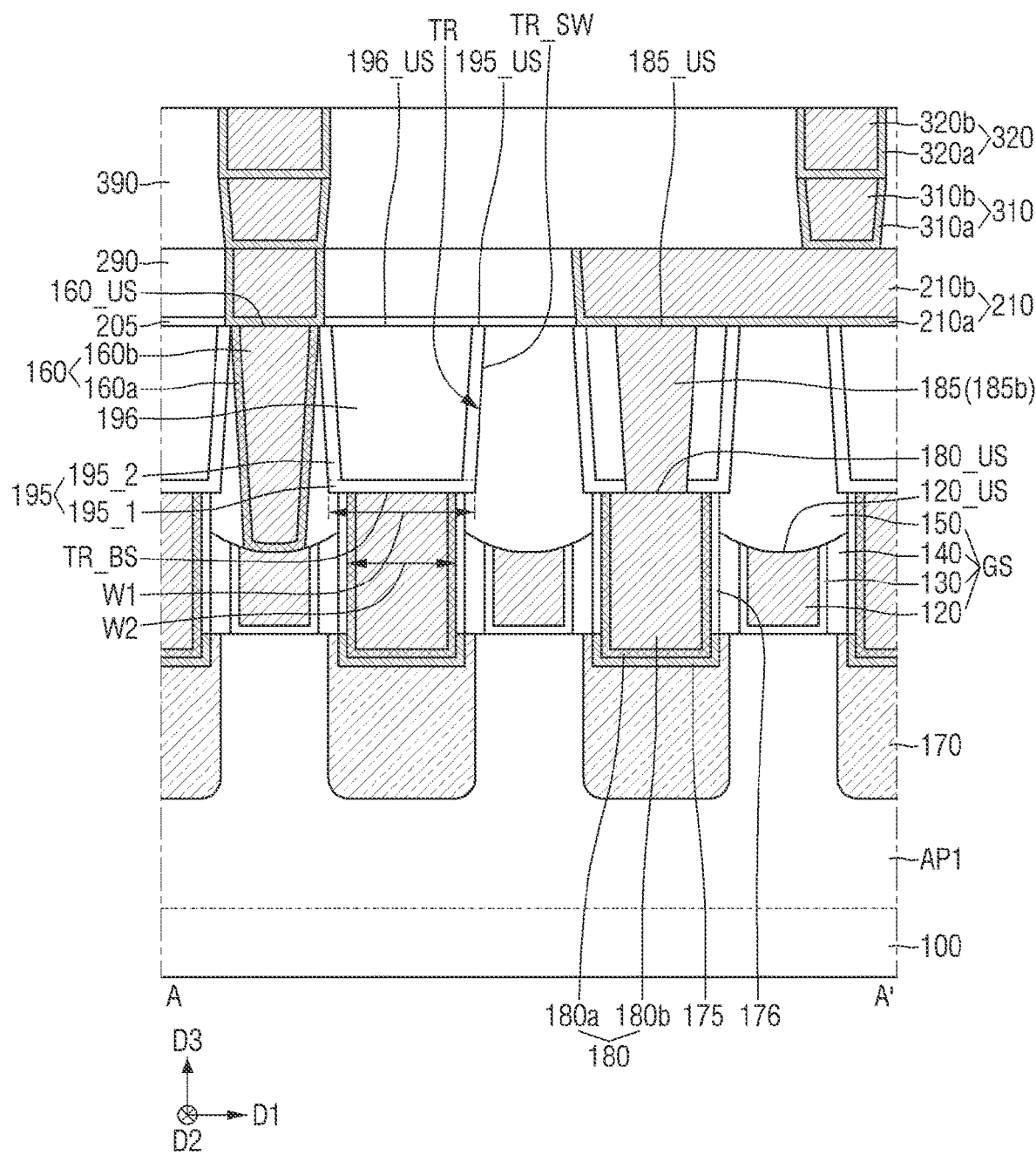
FIG. 7 is a diagram for explaining a semiconductor device according to some embodiments.

FIG. 7 is a diagram for explaining a semiconductor device according to some embodiments. For convenience of explanation, only differences from those described using FIGS. 1 to 3 will be mainly described. For reference, FIG. 7 may be a cross-sectional view taken along A-A' of FIG. 1.

Referring to FIG. 7, the upper active contact 185 may be formed of a single film.

The upper active contacts 185 may not include an upper active contact barrier film. The upper active contact 185 may include only the upper active contact filling film 185*b*.

The upper active contact filling film 185*b* may be in contact with the filling insulation film 196. The upper active contact filling film 185*b* may be spaced apart from the second portion 195_2 of the etching stop film 195 in the first direction D1. The upper active contact filling film 185*b* may not be in contact with the second portion 195_2 of the etching stop film 195. However, the present disclosure is not limited thereto.

Figure 8:
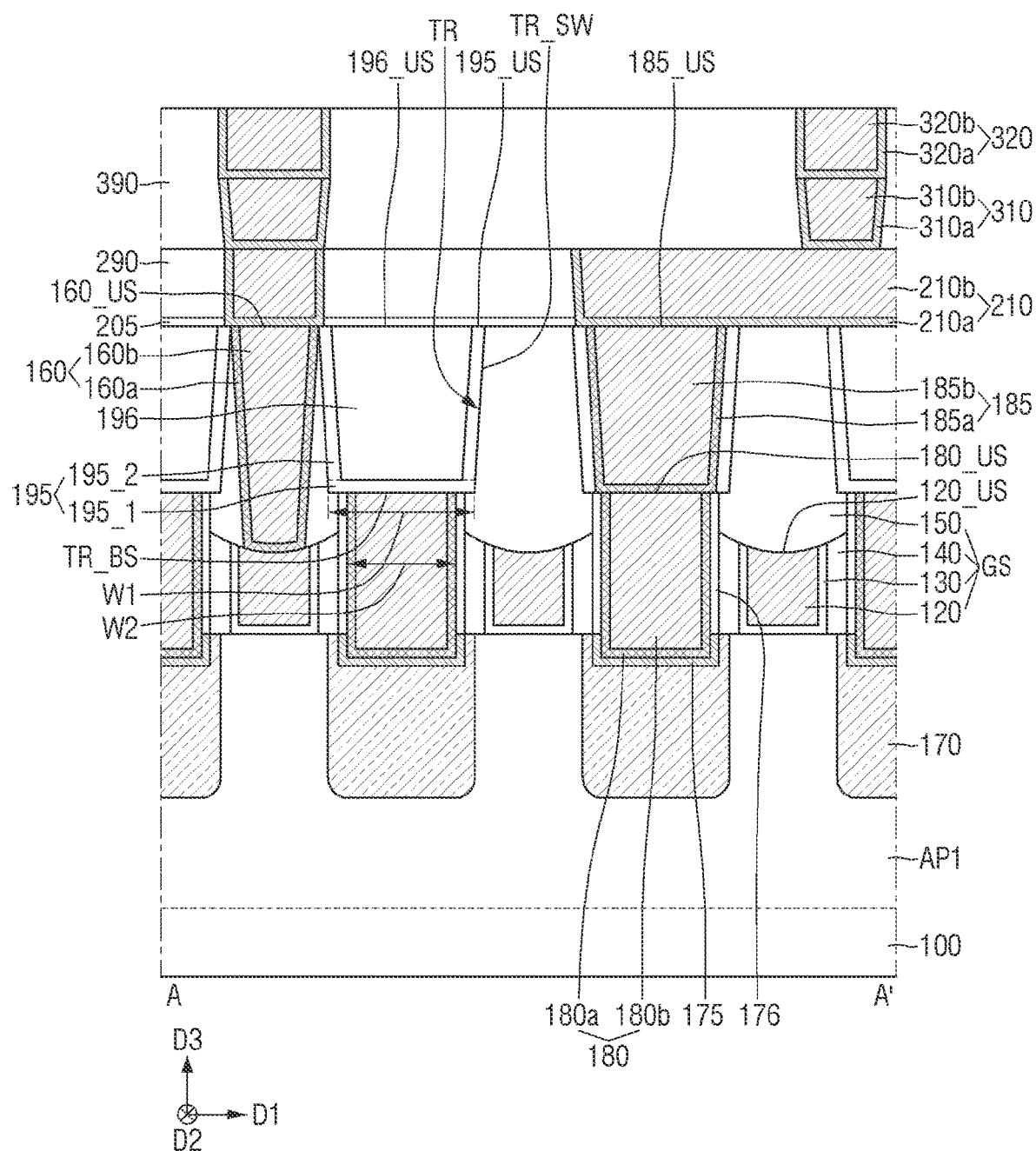
FIG. 8 is a diagram for explaining a semiconductor device according to some embodiments.

FIG. 8 is a diagram for explaining the semiconductor device according to some embodiments. For convenience of explanation, only differences from those described using FIGS. 1 to 3 will be mainly described. For reference, FIG. 8 may be a cross-sectional view taken along A-A' of FIG. 1.

Referring to FIG. 8, at least a part of the upper active contact 185 may be in contact with the second portion 195_2 of the etching stop film 195.

The filling insulation film 196 may be absent in the first direction D1 from between the upper active contact 185 and the second portion 195_2 of the etching stop film 195.

Figure 9:
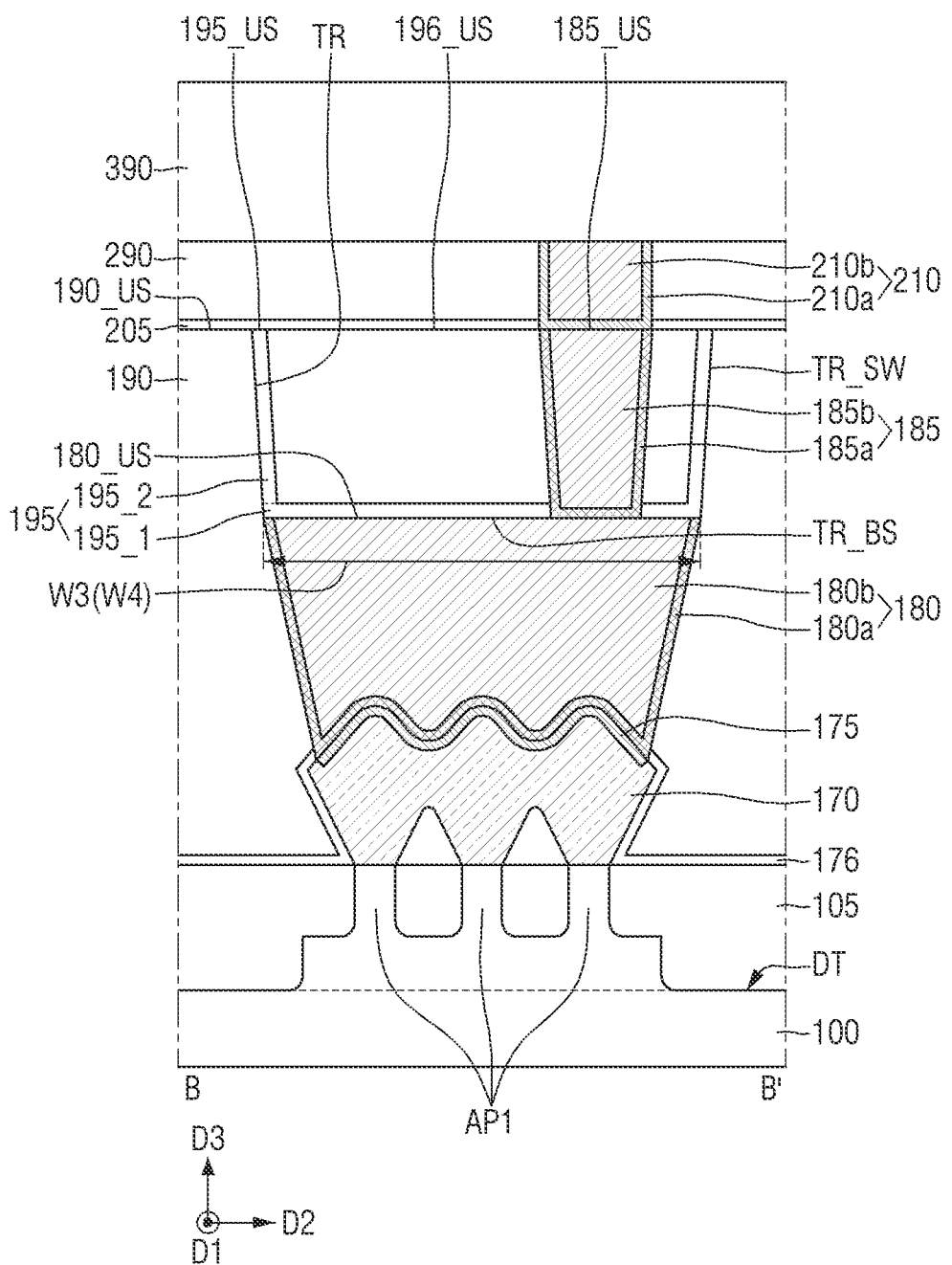
FIG. 9 is a diagram for explaining a semiconductor device according to some embodiments.

FIG. 9 is a diagram for explaining a semiconductor device according to some embodiments. For convenience of explanation, only differences from those described using FIGS. 1 to 3 will be mainly described. For reference, FIG. 9 may be a cross-sectional view taken along B-B' of FIG. 1.

Referring to FIG. 9, a width W3 of the upper surface 180_US of the lower active contact 180 in the second direction D2 may be the same as or equal to a width W4 of the bottom surface TR_BS of the trench TR in the second direction D2.

At the boundary between the lower active contact 180 and the trench TR, the width of the bottom surface TR_BS of the trench TR in the second direction may be the same as or equal to the width of the lower active contact 180 in the second direction D2.

At the boundary between the lower active contact 180 and the first portion 195_1 of the etching stop film 195, the width W3 of the upper surface 180_US of the lower active contact 180 in the second direction D2 may be the same as or equal to the width of the first portion 195_1 of the etching stop film 195 in the second direction D2.

In some embodiments, the material included in the first interlayer insulating film 190 may have an etching selectivity to the material included in the gate capping pattern 150. While the gate capping pattern 150 is removed, the first interlayer insulating film 190 may not be removed. While the trench TR extends in the first direction D1, it may not extend in the second direction D2.

Figure 10:
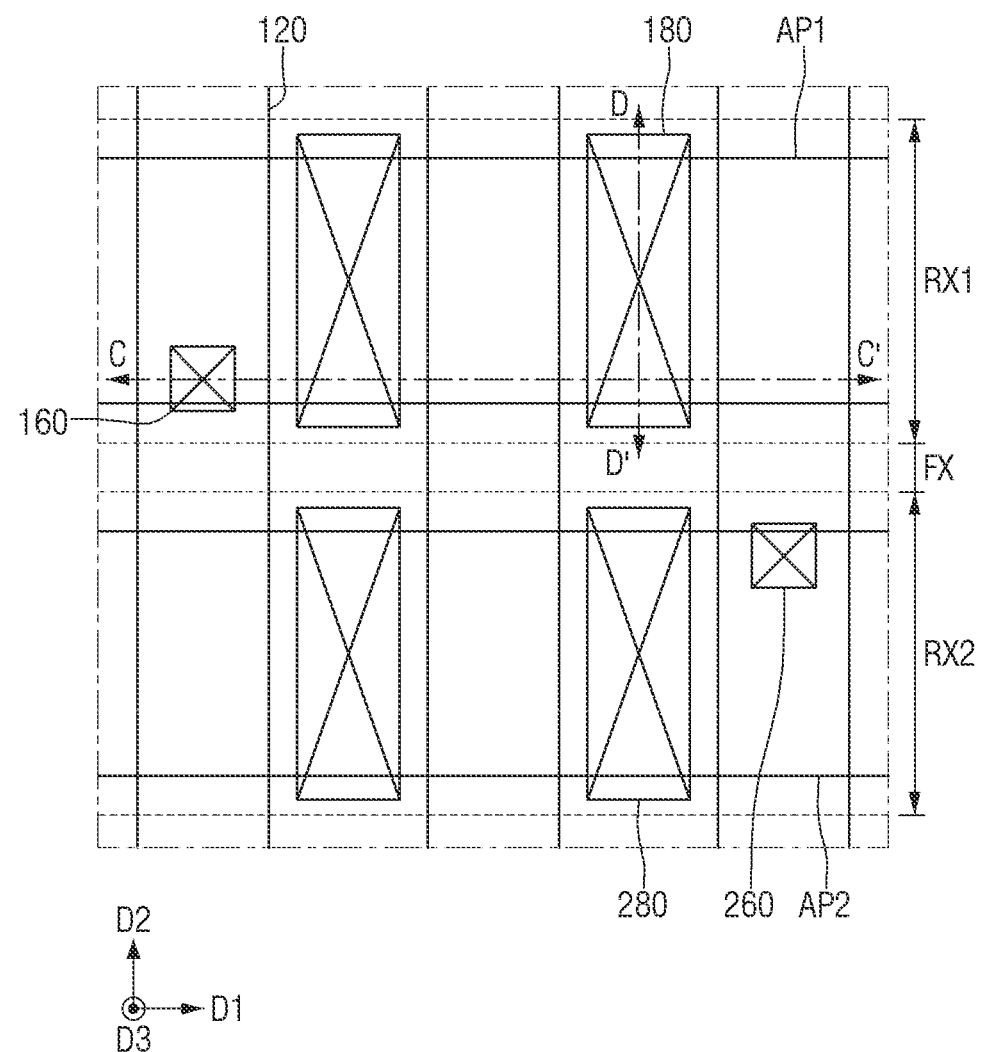
FIG. 10 is a layout diagram for explaining a semiconductor device according to some embodiments.
Figure 11:
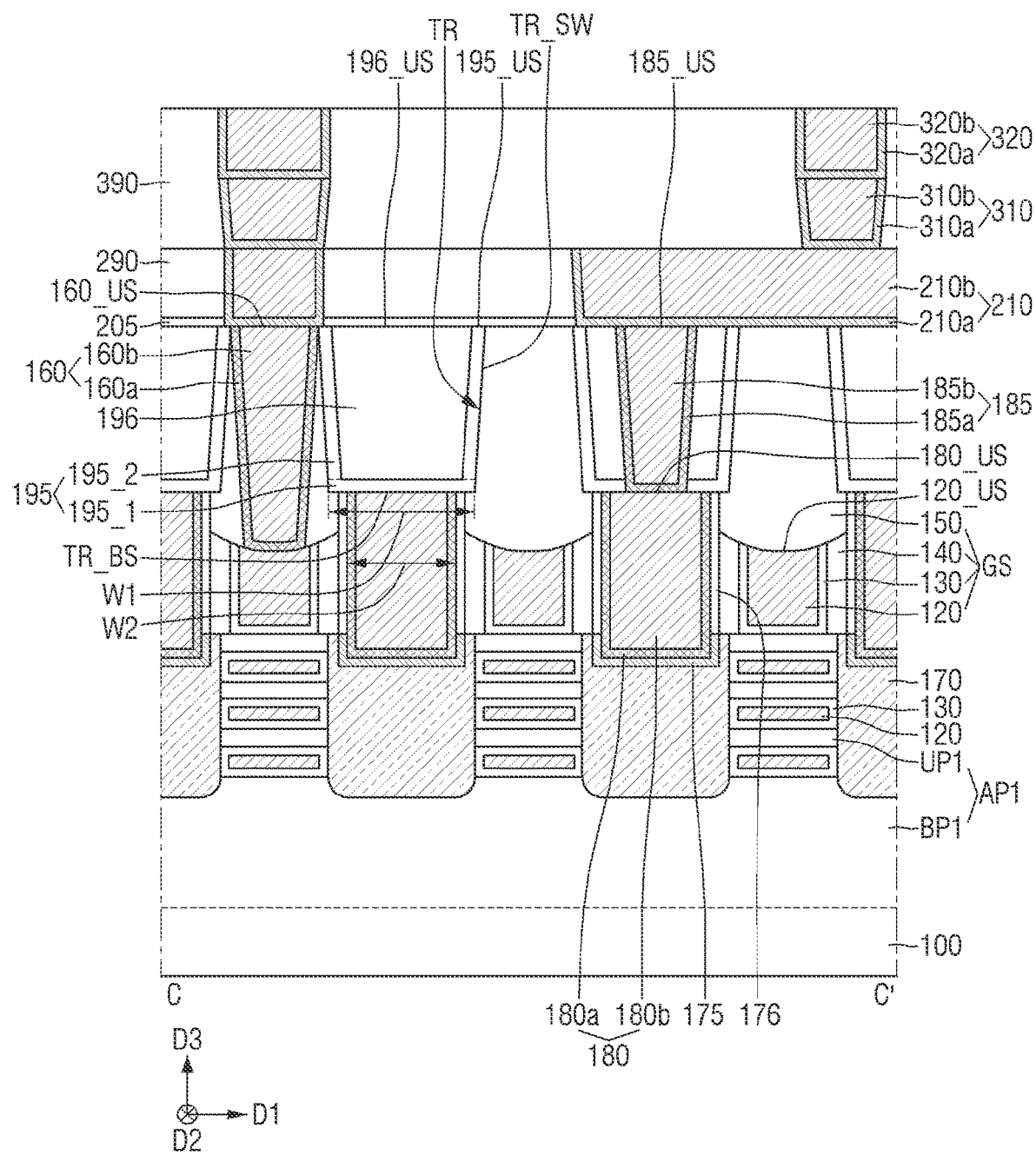
FIG. 11 is a cross-sectional view taken along C-C' of FIG. 10.
Figure 12:
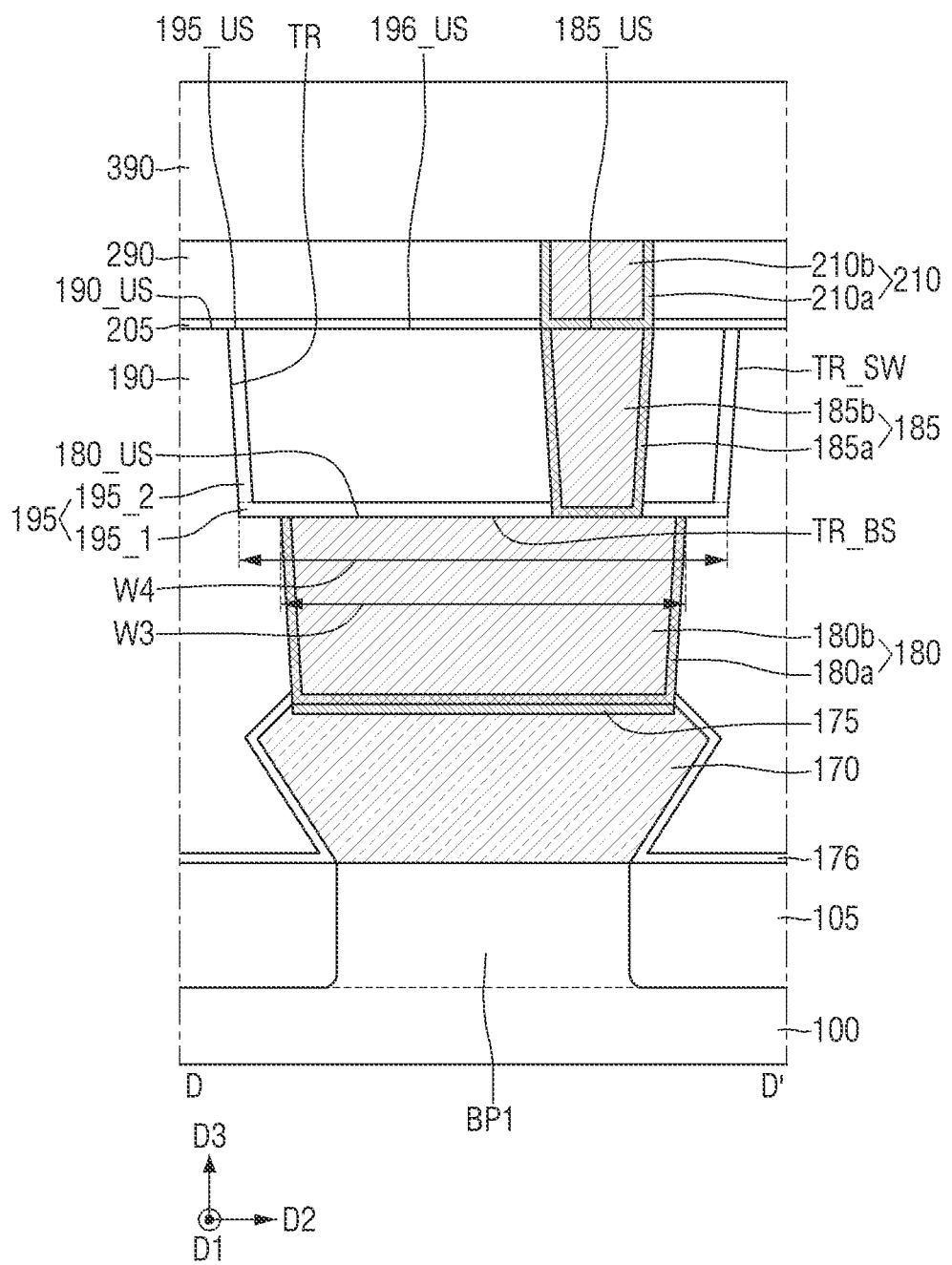
FIG. 12 is a cross-sectional view taken along D-D' of FIG. 10.

FIG. 10 is an exemplary layout diagram for explaining a semiconductor device according to some embodiments. FIG. 11 is an exemplary cross-sectional view taken along C-C' of FIG. 10. FIG. 12 is an exemplary cross-sectional view taken along D-D' of FIG. 10. For convenience of explanation, only differences from those described using FIGS. 1 to 9 will be mainly described.

Referring to FIGS. 10 to 12, in the semiconductor device according to some embodiments, the first active pattern AP1 may include a lower pattern BP1 and a sheet pattern UP1.

Although not shown, the second active pattern AP2 may include a lower pattern and a sheet pattern.

The lower pattern BP1 may extend in the first direction D1. The sheet pattern UP1 may be placed on the lower pattern BP1 to be spaced apart from the lower pattern BP1.

The sheet pattern UP1 may include a plurality of sheet patterns stacked in the third direction D3. Although the three sheet patterns UP1 are shown in FIGS. 10-12, this is merely for convenience of explanation, and the number thereof is not limited thereto.

The sheet pattern UP1 may be connected to the source/drain pattern 170. The sheet pattern UP1 may be a channel pattern that is used as a channel region of a transistor. For example, the sheet pattern UP1 may be nanosheet or nanowire.

The gate electrode 120 may be on the lower pattern BP1. The gate electrode 120 may intersect or cross the lower pattern BP1. The gate electrode 120 may wrap around the sheet pattern UP1. The gate electrode 120 may be between the lower pattern BP1 and the sheet pattern UP1, and between the adjacent sheet patterns UP1.

In FIG. 11, the gate spacer 140 may include only the outer spacer. An inner space may be absent from between the lower pattern BP1 and the sheet pattern UP1, and from between the adjacent sheet patterns UP1.

In FIG. 12, the source/drain pattern 170 may be formed on the lower pattern BP1. The source/drain pattern 170 may include a portion in which the width in the second direction D2 increases and a portion in which the width in the second direction D2 decreases, as a distance from an upper surface of the substrate 100 increases. However, the technical idea of the present disclosure is not limited thereto.

Figure 13:
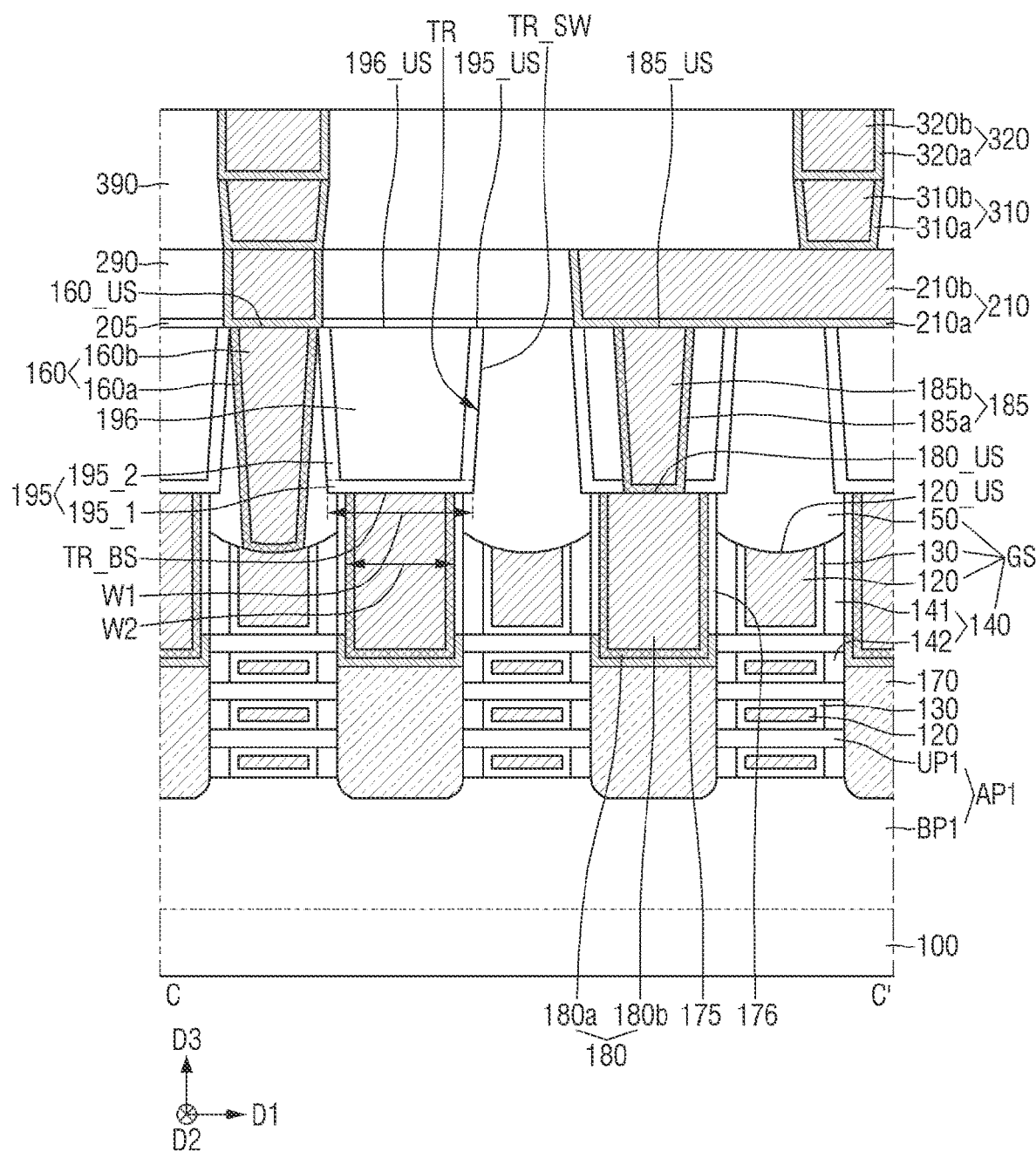
FIG. 13 is a diagram for explaining a semiconductor device according to some embodiments.

FIG. 13 is a diagram for explaining a semiconductor device according to some embodiments. For convenience of explanation, only differences from those described using FIGS. 10 to 12 will be mainly described. For reference, FIG. 13 may be a cross-sectional view taken along C-C' of FIG. 10.

Referring to FIG. 13, the gate spacer 140 may include an outer spacer 141 and an inner spacer 142.

The inner spacer 142 may be between the lower pattern BP1 and the sheet pattern UP1, and between the adjacent sheet patterns UP1.

FIGS. 14 to 35 are intermediate stage diagrams for explaining a method for the manufacturing the semiconductor device according to some embodiments.

For reference, FIGS. 14, 16, 18, 20, 22, 24, 26, 28, 30, 32, 34, and 35 may be cross-sectional views taken along A-A' of FIG. 1. For reference, FIGS. 15, 17, 19, 21, 23, 25, 27, 29, 31 and 33 may be cross-sectional views taken along B-B' of FIG. 1.

Hereinafter, a method for manufacturing a semiconductor device according to some embodiments will be described referring to FIGS. 14 to 35. The following manufacturing method will be described in terms of cross-sectional views.

Figure 14:
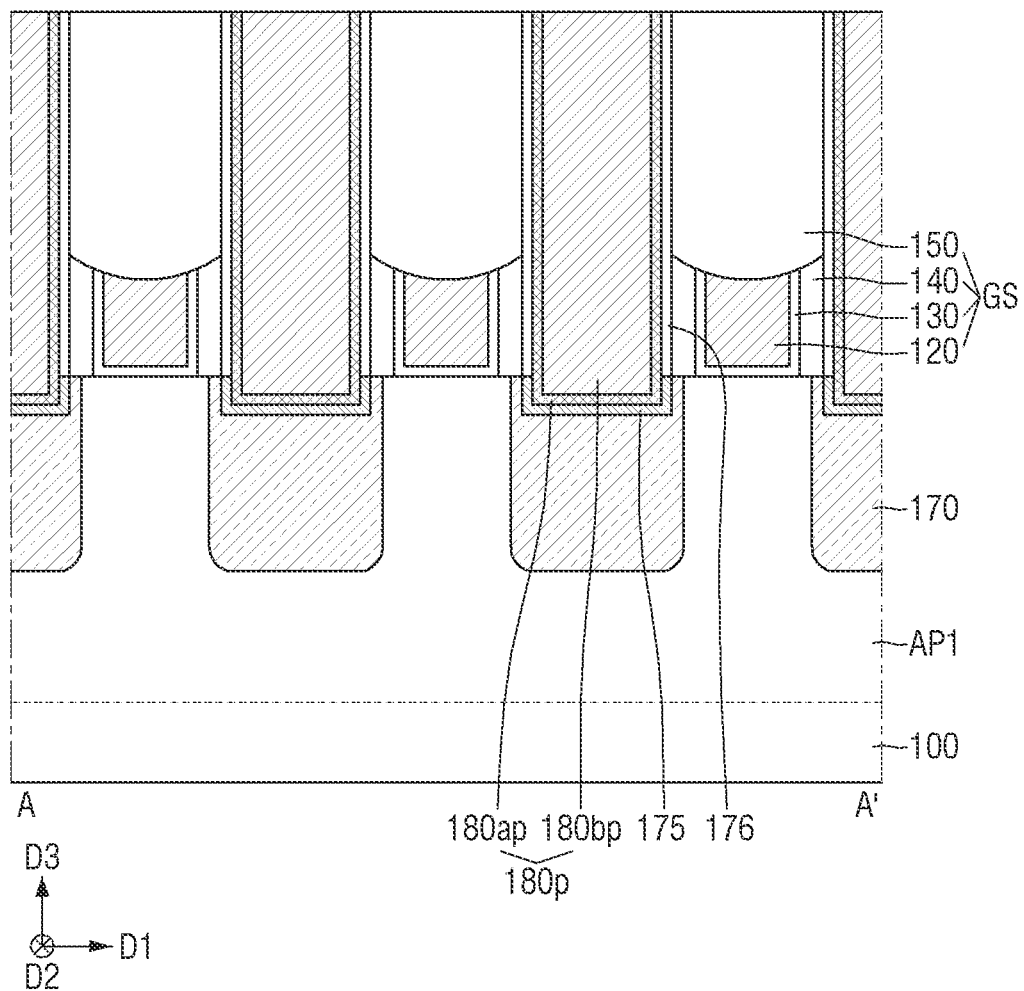
FIGS. 14 to 35 are intermediate stage diagrams for explaining a method for the manufacturing the semiconductor device according to some embodiments.
Figure 15:
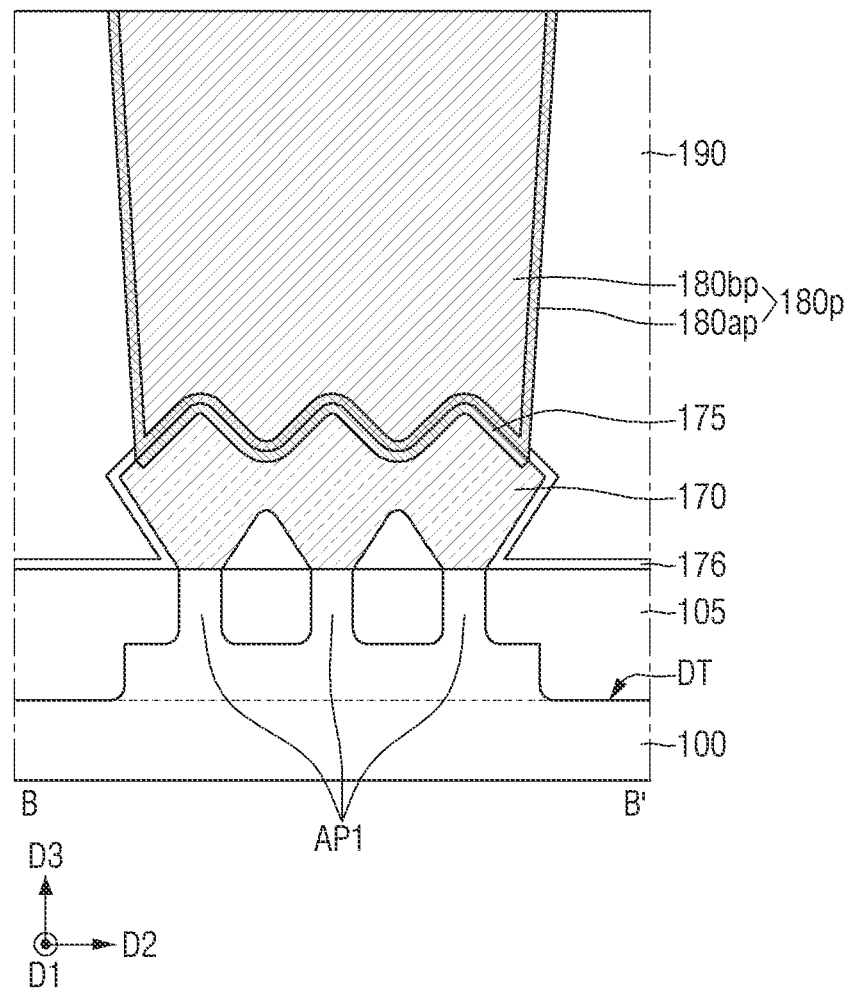

Referring to FIGS. 14 and 15, a pre lower active contact 180p may be formed on the source/drain pattern 170.

The pre lower active contact 180p may be formed between adjacent gate structures GS. The pre lower active contact 180p may be formed inside the first interlayer insulating film 190. The pre lower active contact 180p may include a pre active contact barrier film 180ap and a pre lower active contact filling film 180bp.

Figure 16:
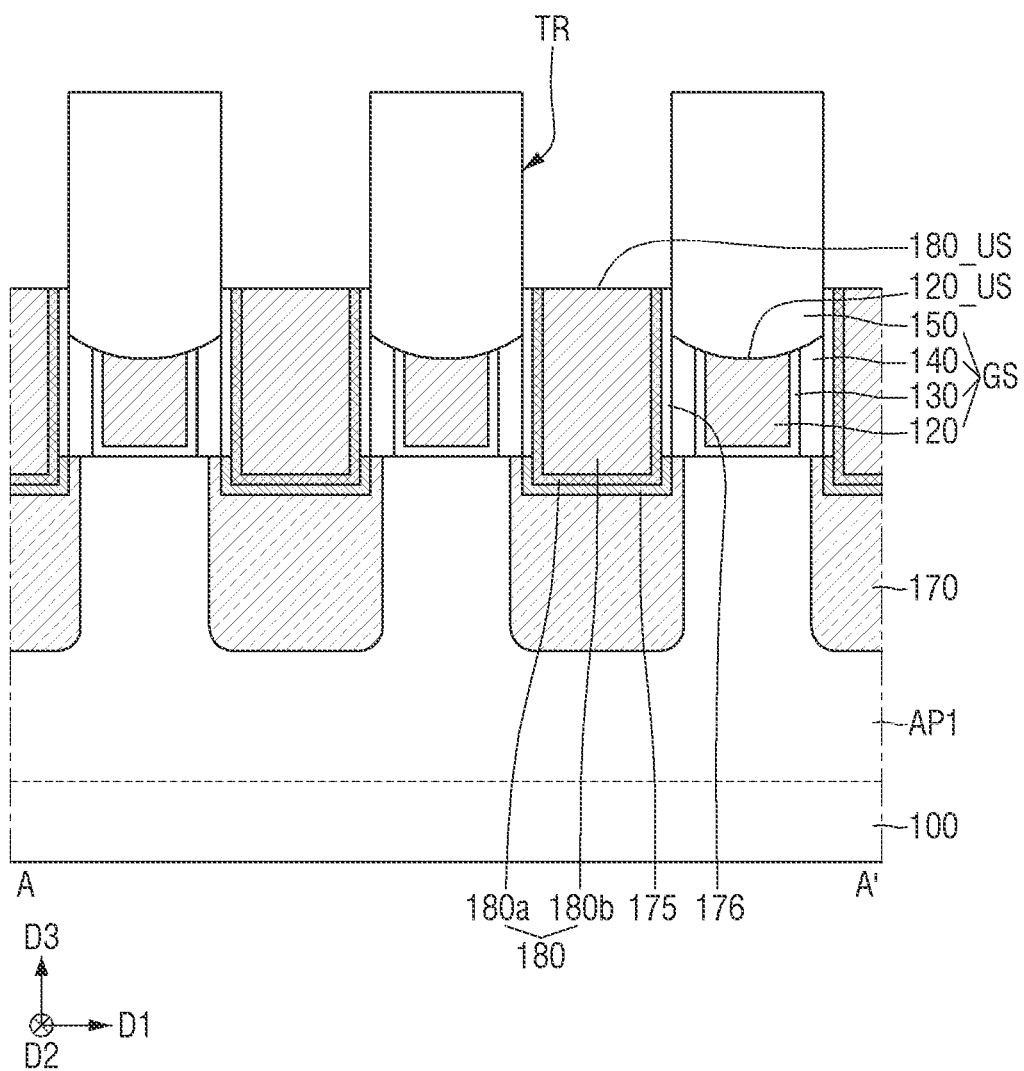
Figure 17:
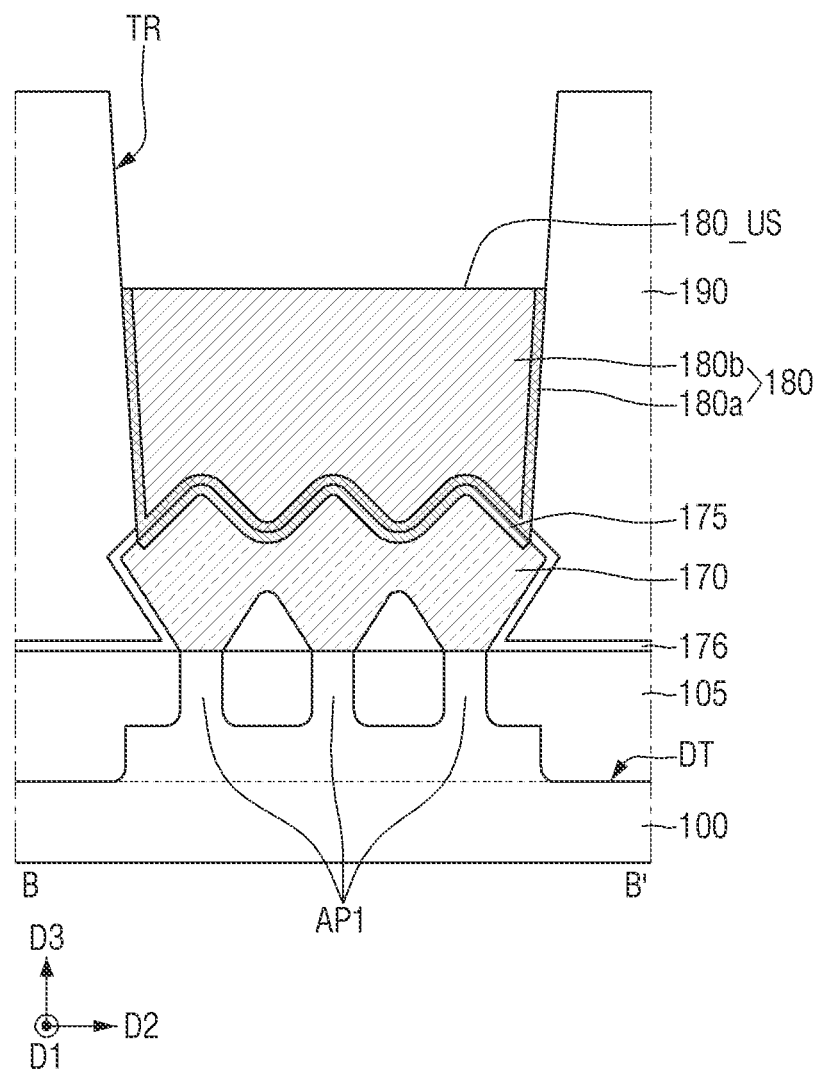

Referring to FIGS. 16 and 17, a part of the pre lower active contact 180p may be removed to form a trench TR.

A part of the pre lower active contact 180p may be removed to form a lower active contact 180. An upper surface 180_US of the lower active contact 180 may be formed to be higher than the upper surface 120_US of the gate electrode 120 on the basis of the upper surface of the substrate 100. However, the present disclosure is not limited thereto, and the upper surface 180_US of the lower active contact 180 may also be formed at the same position as (or coplanar with) the upper surface 120_US of the gate electrode 120, as measured from the upper surface of the substrate 100.

Figure 18:
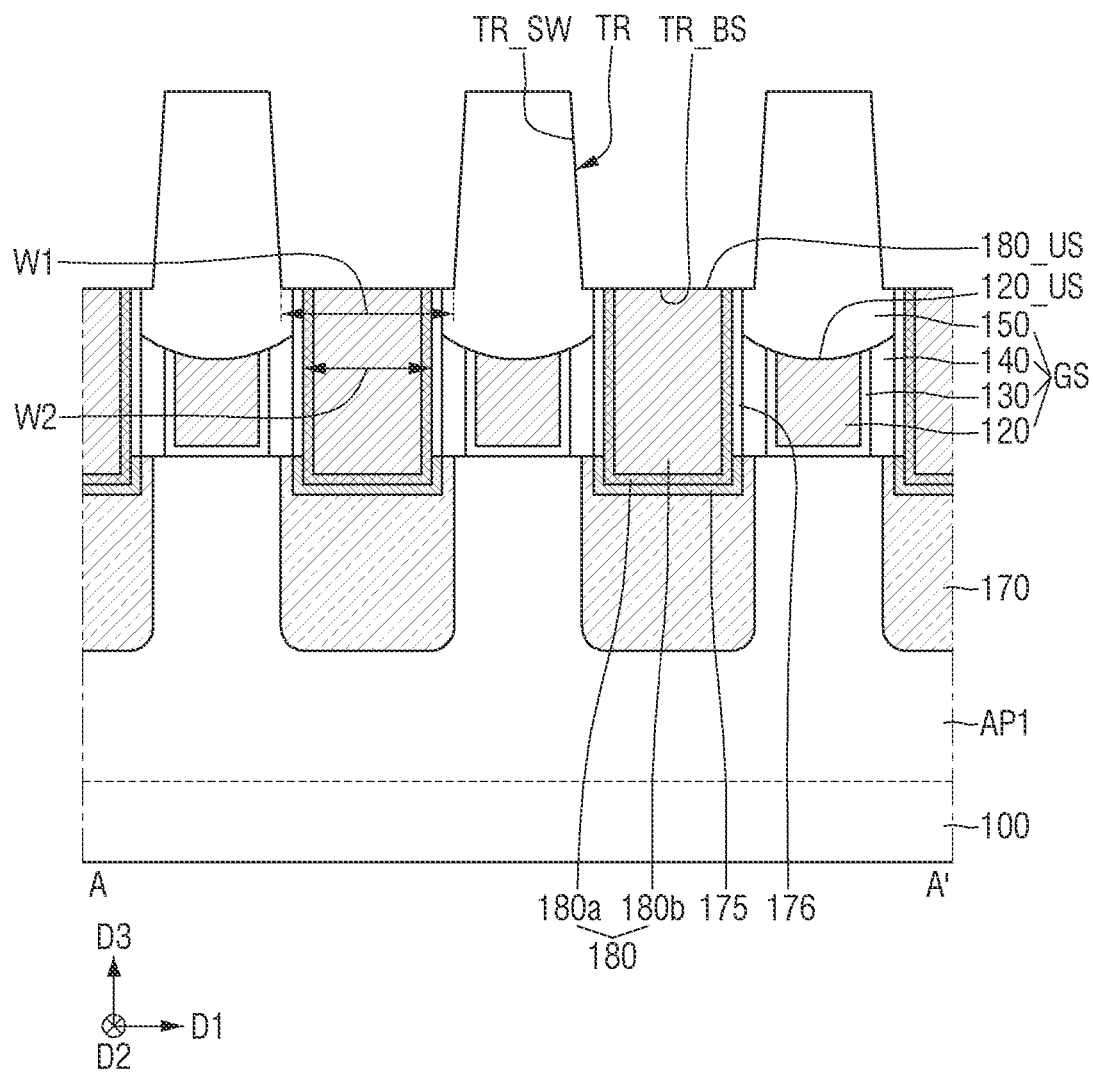
Figure 19:
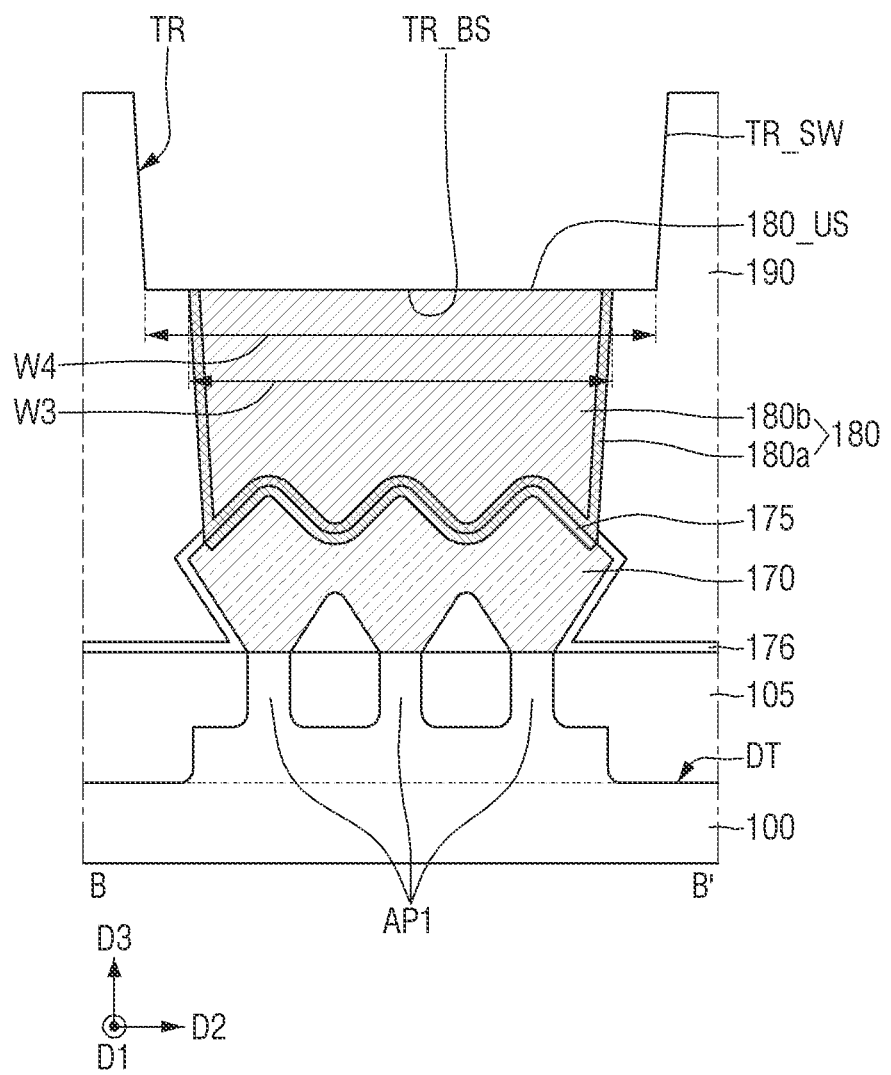

Referring to FIGS. 18 and 19, the trench TR may be expanded in the first direction D1 and the second direction D2.

In FIG. 18, the width of the trench TR in the first direction D1 may be expanded. The width between the side walls TR_SW of the adjacent trenches TR in the first direction D1 may decrease. The width W1 of the bottom surface TR_BS of the trench TR in the first direction D1 may be greater than the width W2 of the upper surface 180_US of the lower active contact 180 in the first direction D1.

In FIG. 19, the width of the trench TR in the second direction D2 may be expanded. The width W4 of the bottom surface TR_BS of the trench TR in the second direction D2 may be greater than the width W3 of the upper surface 180_US of the lower active contact 180 in the second direction D2. However, the present disclosure is not limited to thereto. While the trench TR is expanded in the first direction D1, it may not be expanded in the second direction D2. In this case, the width W4 of the bottom surface TR_BS of the trench TR in the second direction D2 may be the same as the width W3 of the upper surface 180_US of the lower active contact 180 in the second direction D2.

Figure 20:
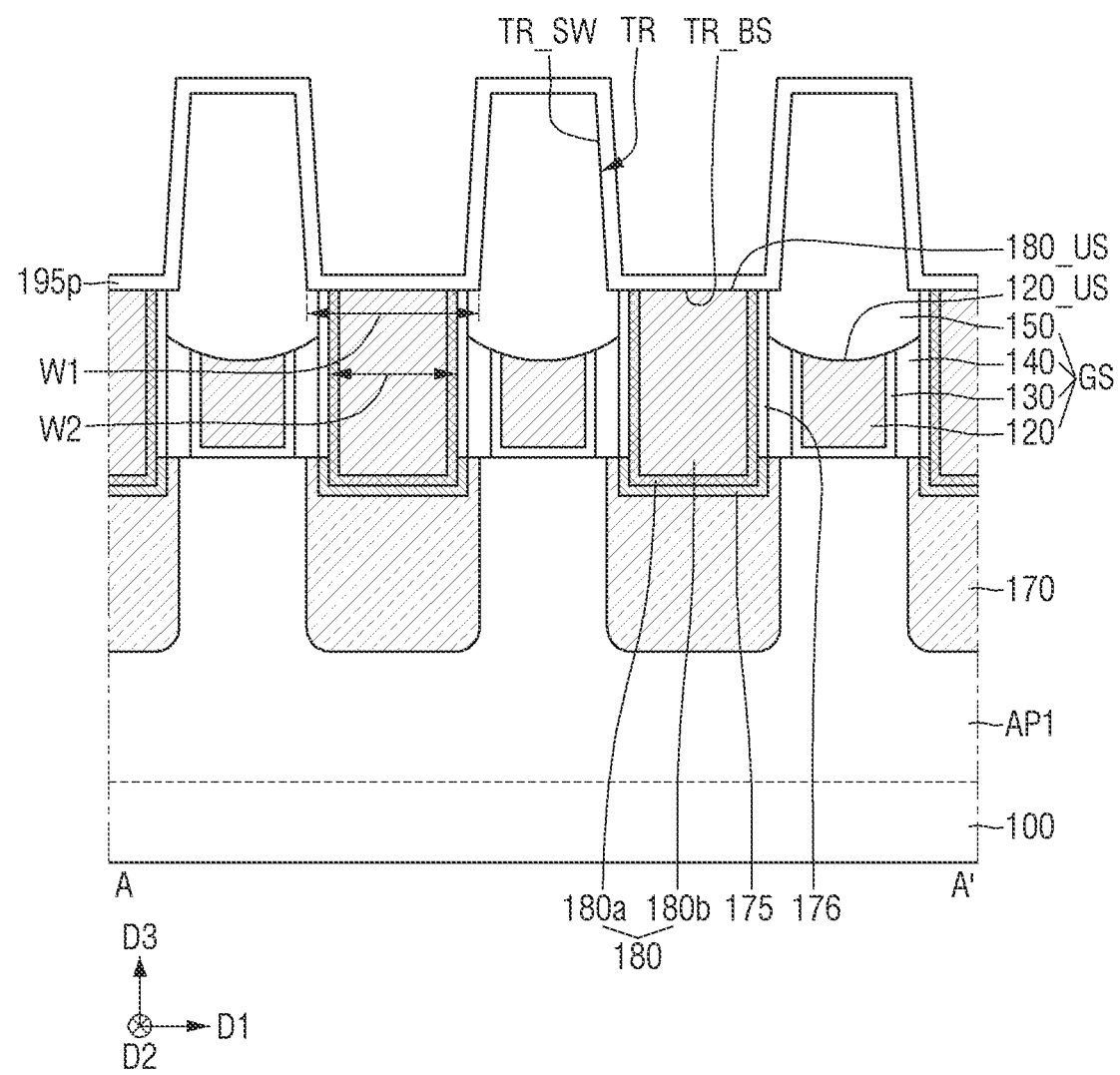
Figure 21:
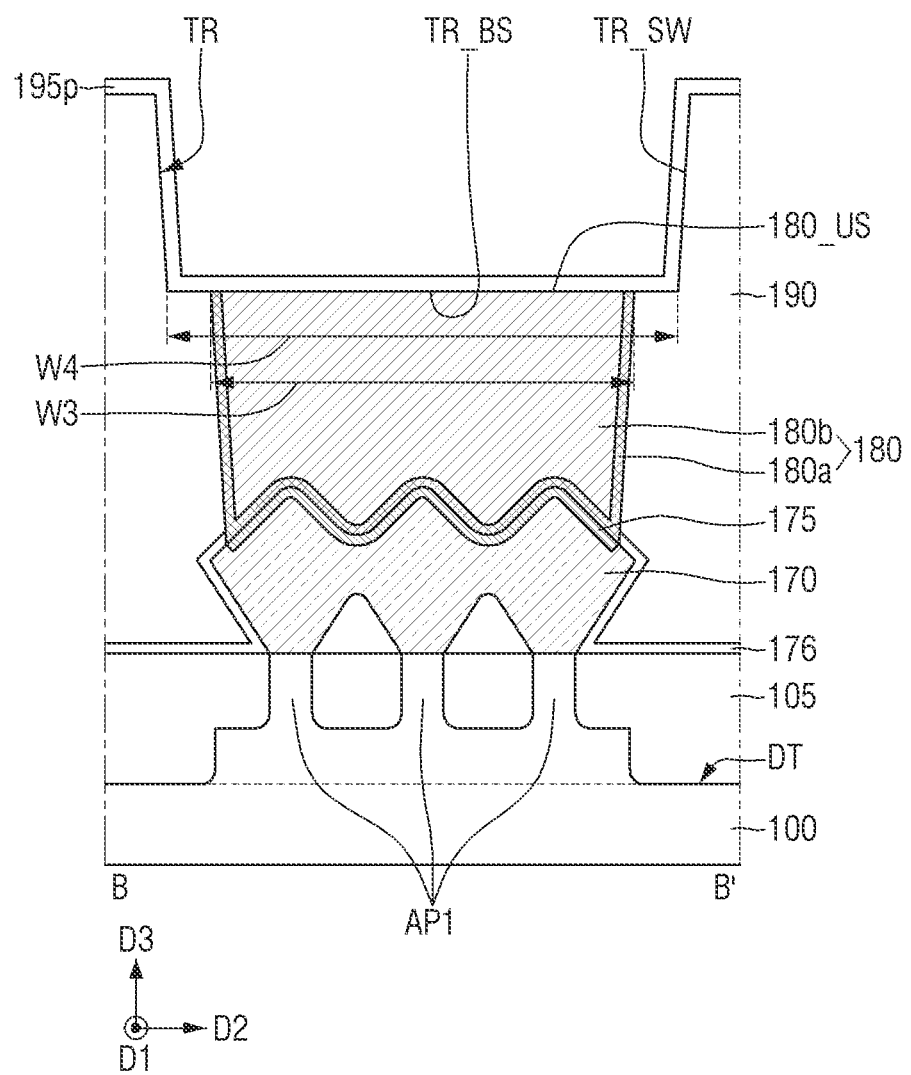

Referring to FIGS. 20 and 21, a pre etching stop film 195p may be formed along the side walls TR_SW of the trench TR, the bottom surface TR_BS of the trench TR, the upper surface of the gate capping pattern 150, and the upper surface of the first interlayer insulating film 190.

The pre etching stop film 195p may be formed by utilizing an atomic layer deposition (ALD) or a chemical vapor deposition (CVD). The pre etching stop film 195p may be formed along and conform to the side walls TR_SW of the trench TR, the bottom surface TR_BS of the trench TR, the upper surface of the gate capping pattern 150, and the upper surface of the first interlayer insulating film 190. However, the present disclosure is not limited to thereto.

The pre etching stop film 195p may include, but is not limited to, at least one of, for example, aluminum oxide (AlO) and/or aluminum nitride (AlN).

Figure 22:
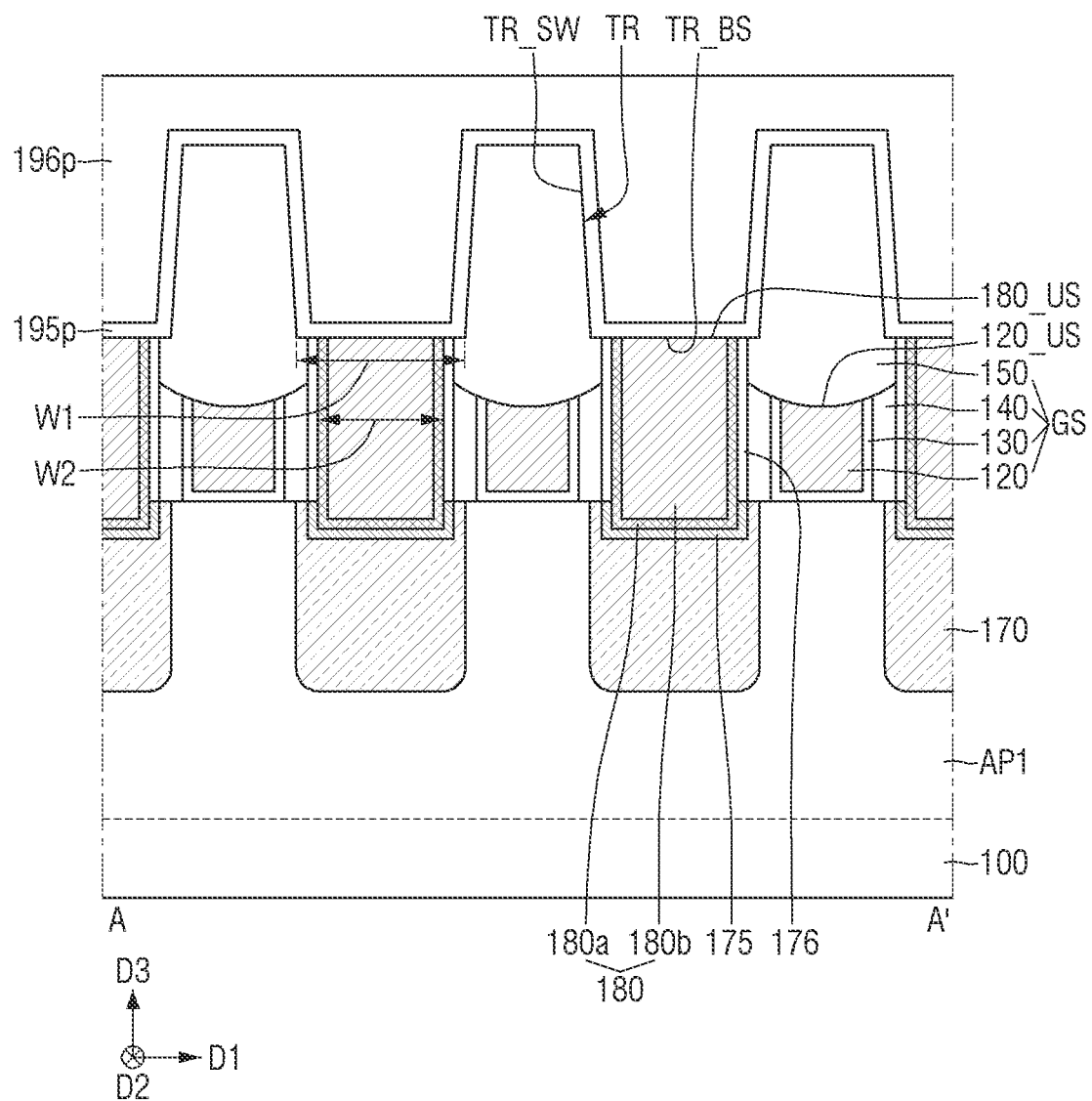
Figure 23:
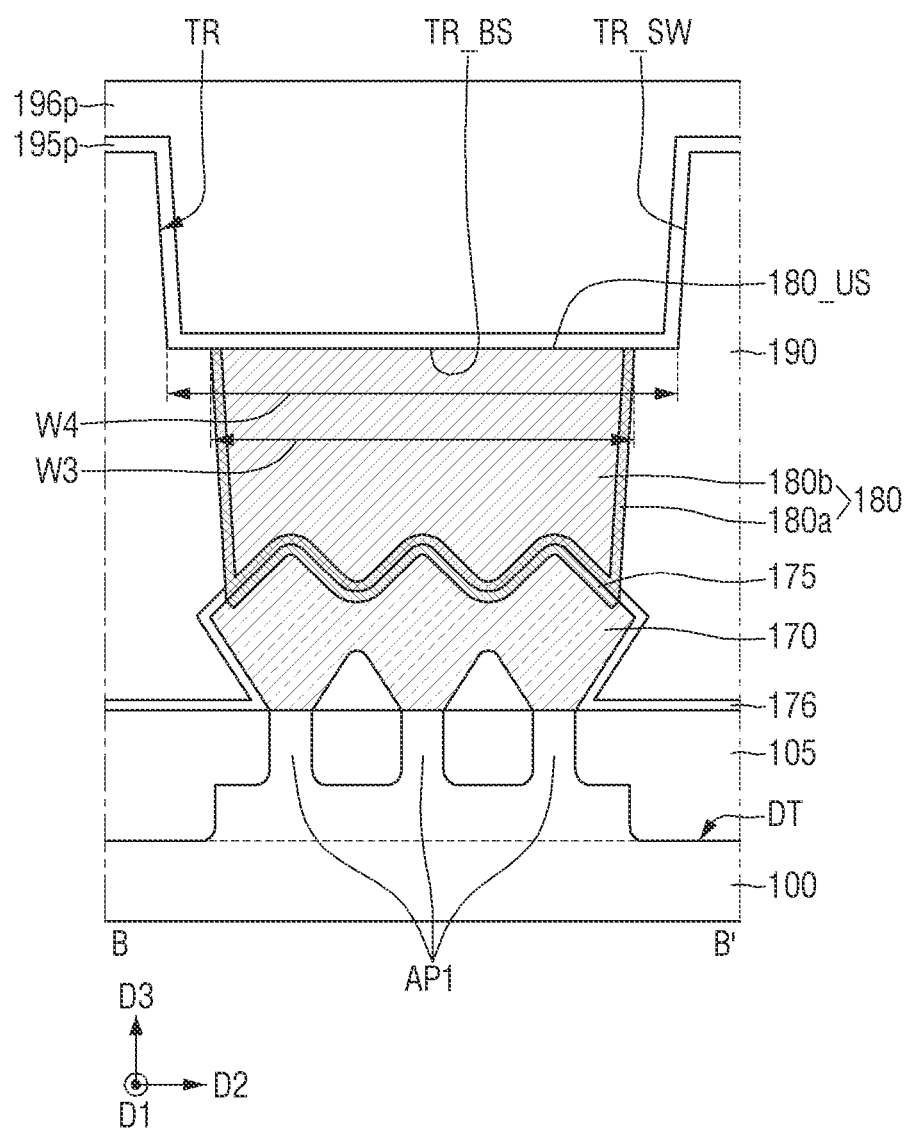

Referring to FIGS. 22 and 23, a pre filling insulation film 196p may be formed on the pre etching stop film 195p.

The pre filling insulation film 196p may be formed by utilizing at least one of a chemical vapor deposition (CVD), a physical vapor deposition (PVD), and an atomic layer deposition (ALD).

The pre etching stop film 195p may fill the remaining portion of the trench TR subsequent to the formation of the pre filling insulation film 196p. The pre filling insulation film 196p may include, but is not limited to, at least one of silicon nitride (SiN), silicon oxycarbide (SiOC), and/or silicon oxide (SiO).

Figure 24:
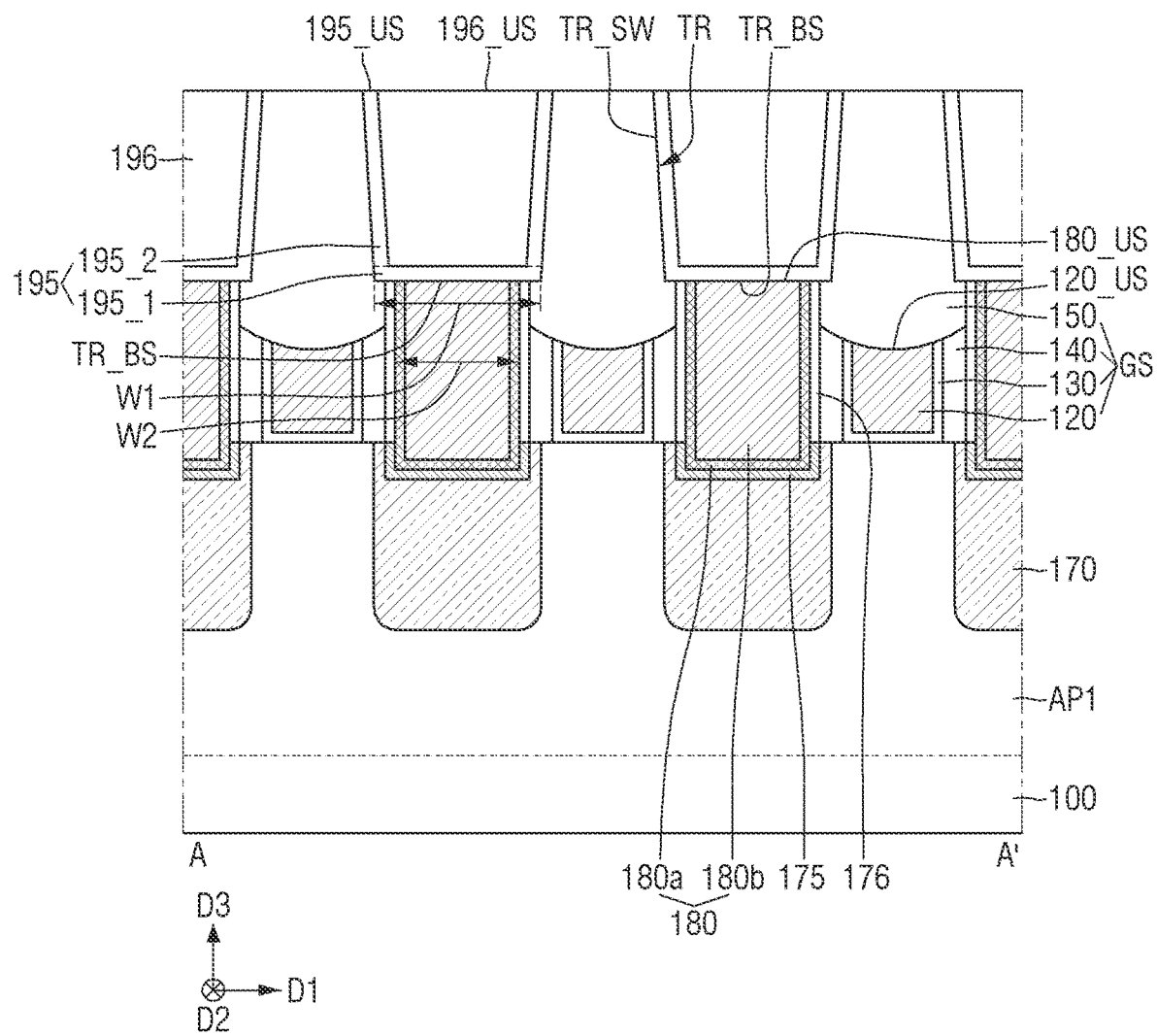
Figure 25:
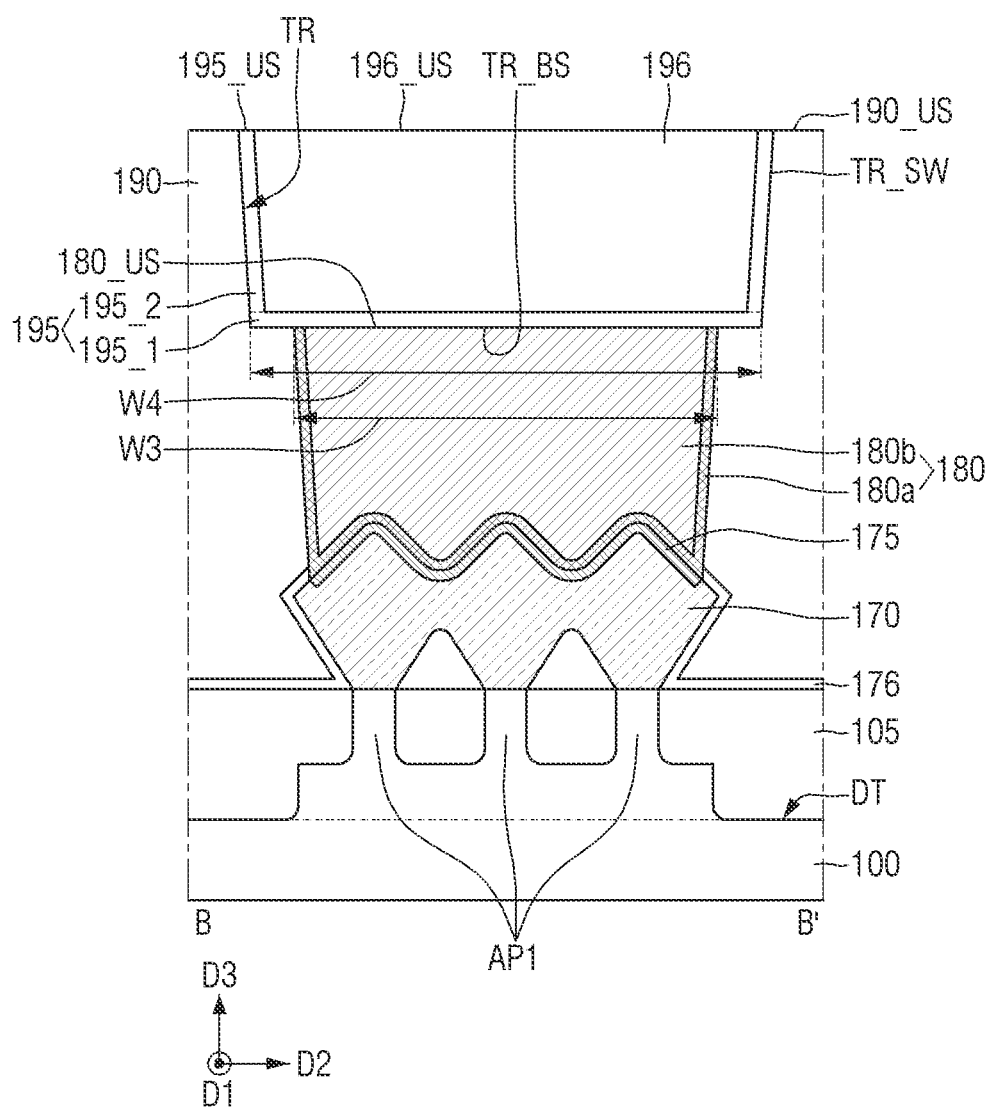

Referring to FIGS. 24 and 25, the pre filling insulation film 196p and the pre etching stop film 195p may be removed, by utilizing a chemical mechanical polishing (CMP) process.

The pre filling insulation film 196p and the pre etching stop film 195p may be removed to form the filling insulation film 196 and the etching stop film 195. The pre filling insulation film 196p and the pre etching stop film 195p may be removed to expose the upper surface of the gate capping pattern 150. The pre filling insulation film 196p and the pre etching stop film 195p may be removed to expose the upper surface 190_US of the first interlayer insulating film 190. The upper surface 196_US of the filling insulation film 196, the uppermost surface 195_US of the etching stop film 195, the upper surface 190_US of the first interlayer insulating film 190, and the upper surface of the gate capping pattern 150 may be located on the same plane.

Figure 26:
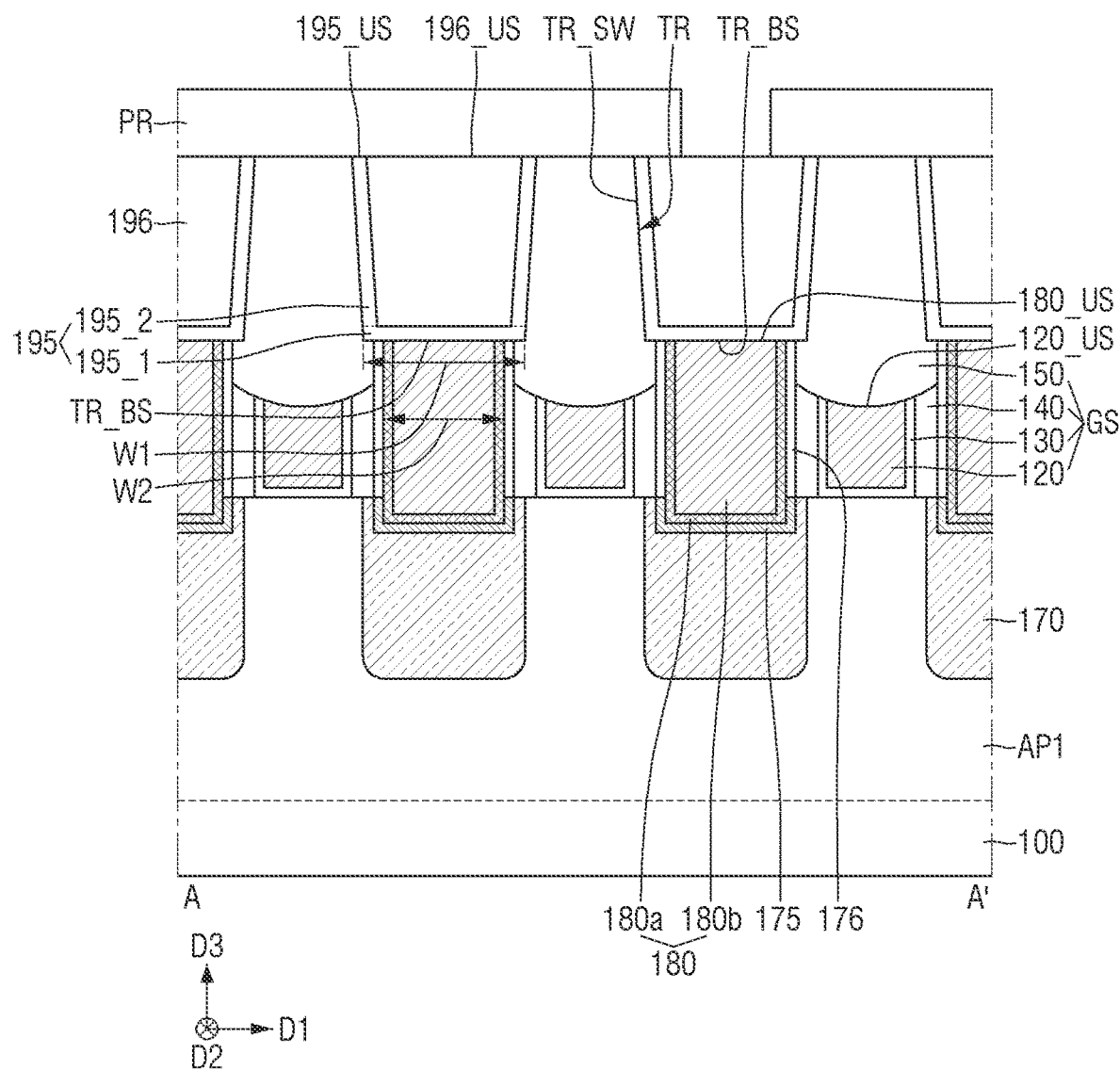
Figure 27:
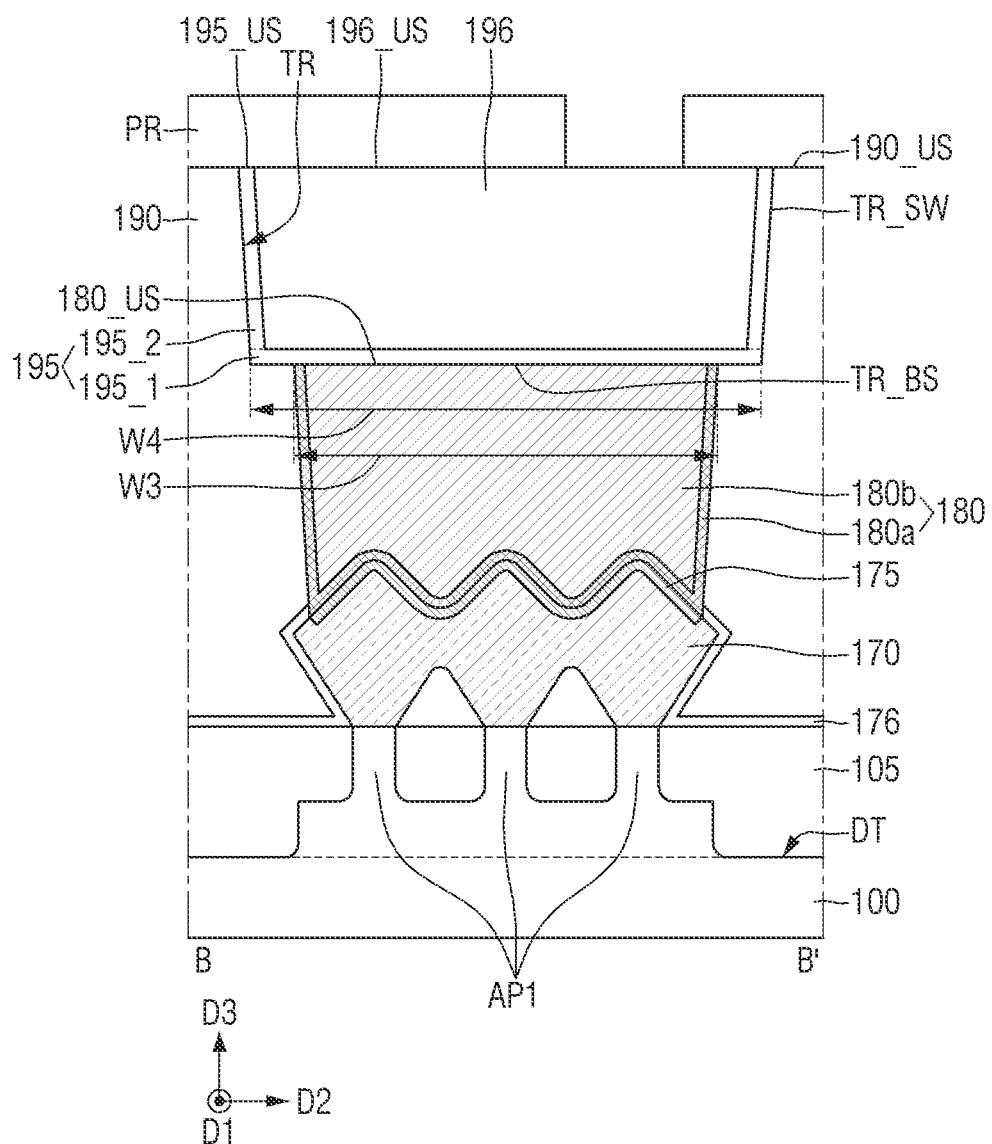

Referring to FIGS. 26 and 27, a photosensitive film PR may be formed on the gate capping pattern 150, the etching stop film 195, the filling insulation film 196 and the first interlayer insulating film 190.

The photosensitive film PR may be used as a mask for forming an upper active contact 185 to be explained below.

Figure 28:
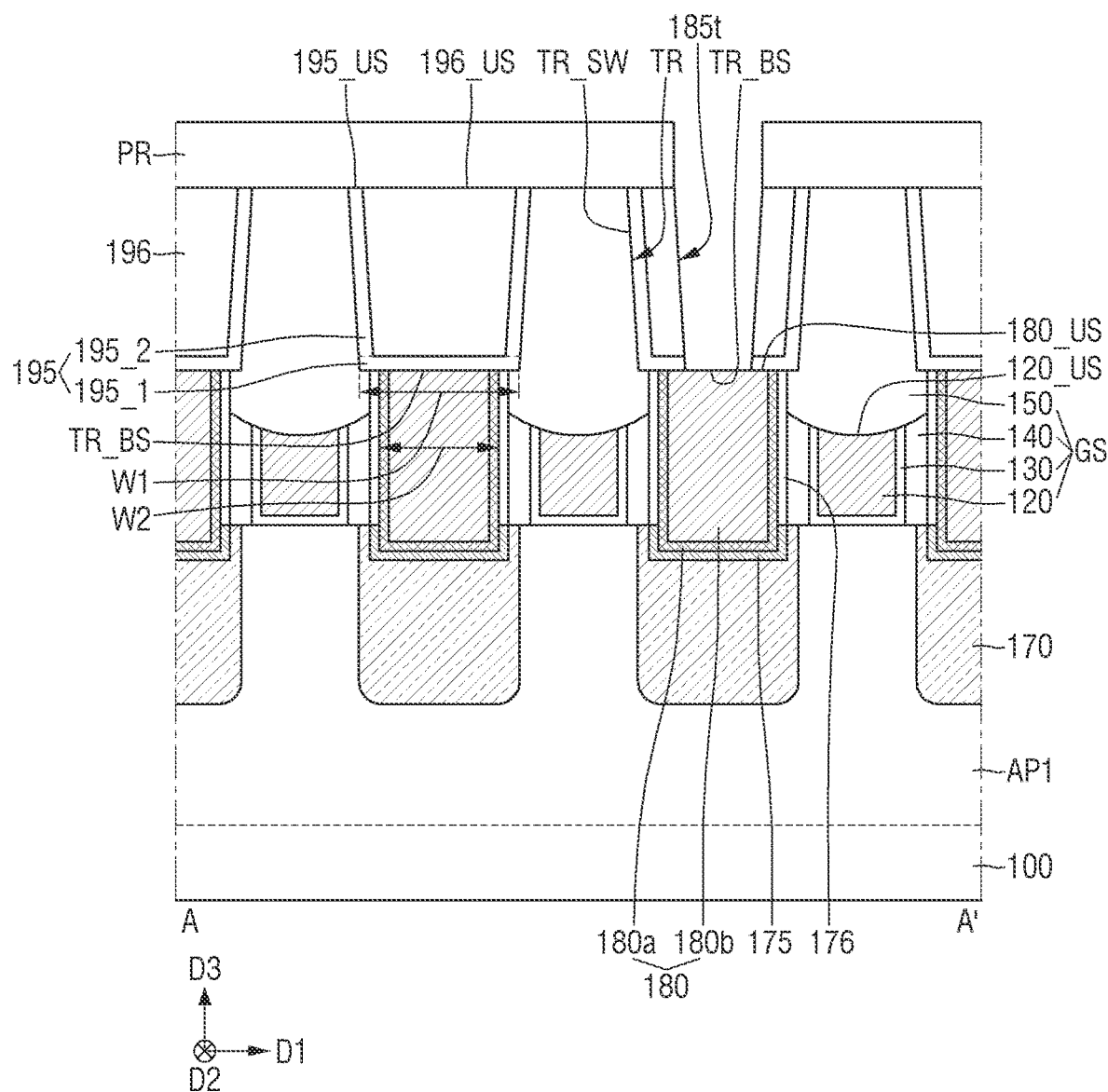
Figure 29:
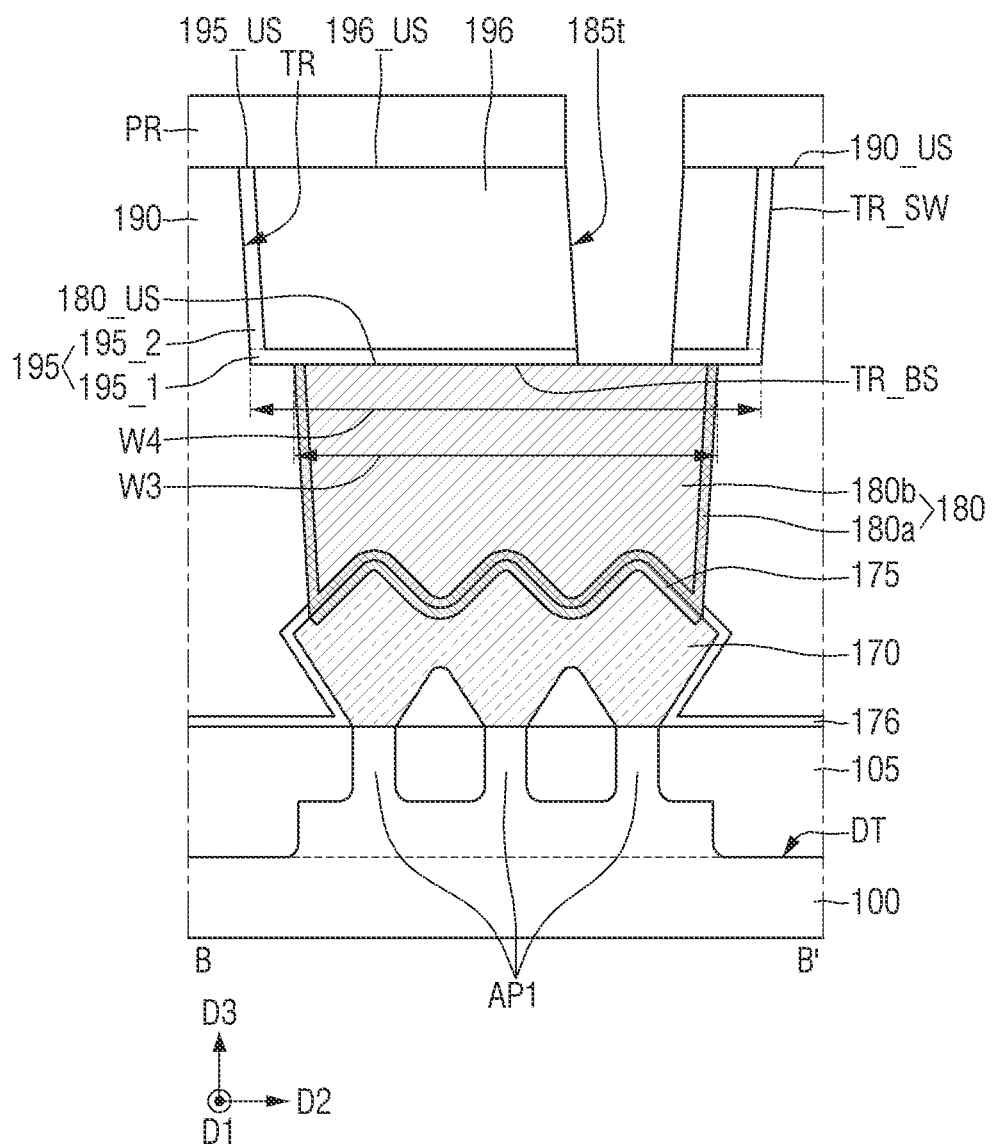

Referring to FIGS. 28 and 29, an upper active contact hole 185t may be formed by utilizing the photosensitive film PR as a mask.

The upper active contact hole 185t may be formed to penetrate or extend through the filling insulation film 196 and the etching stop film 195 in the third direction D3. When penetrating the filling insulation film 196, a dry etching process may be used. When penetrating the etching stop film 195, a wet etching process may be used. The upper active contact hole 185t may expose the lower active contact 180.

Figure 30:
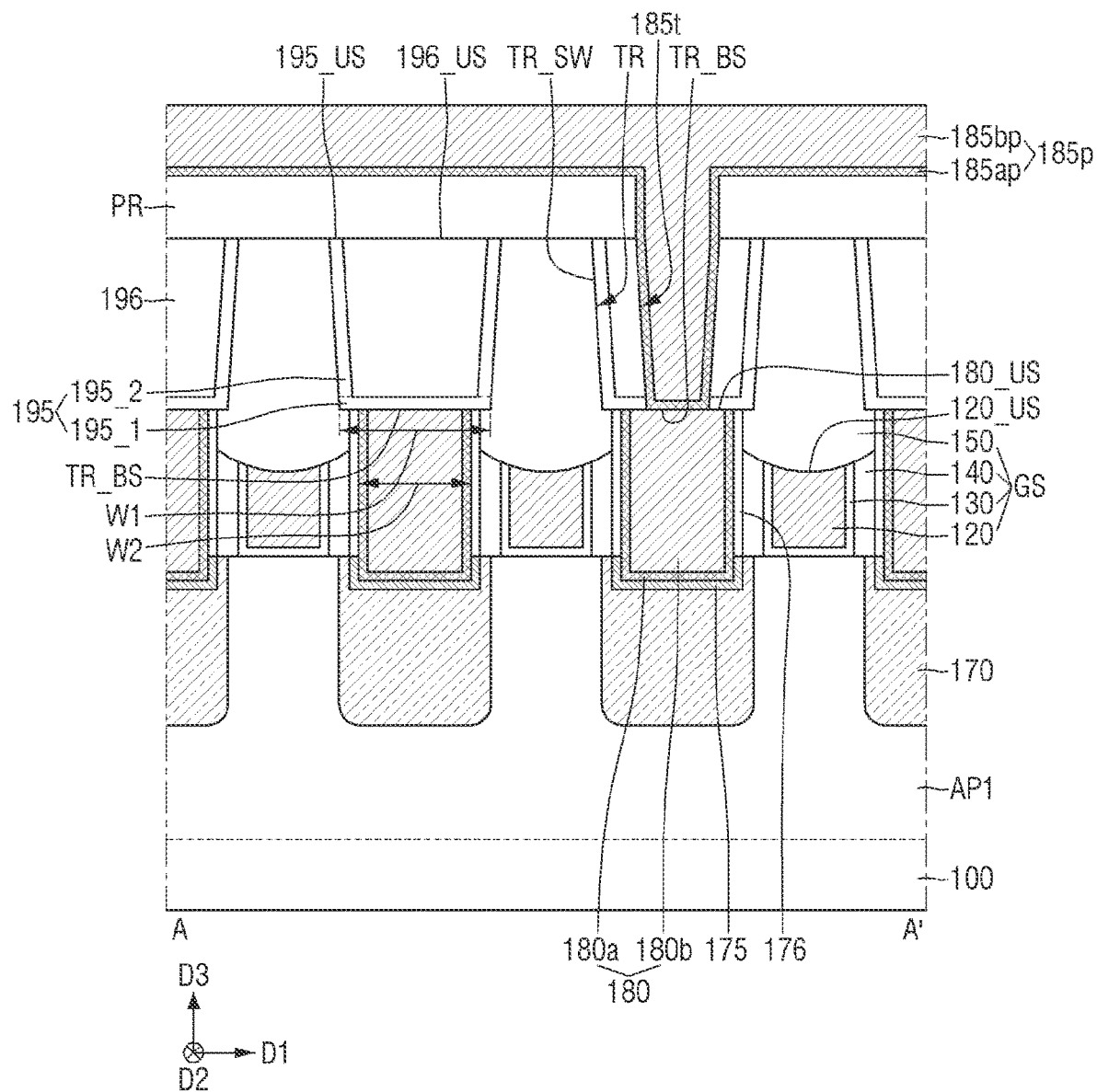
Figure 31:
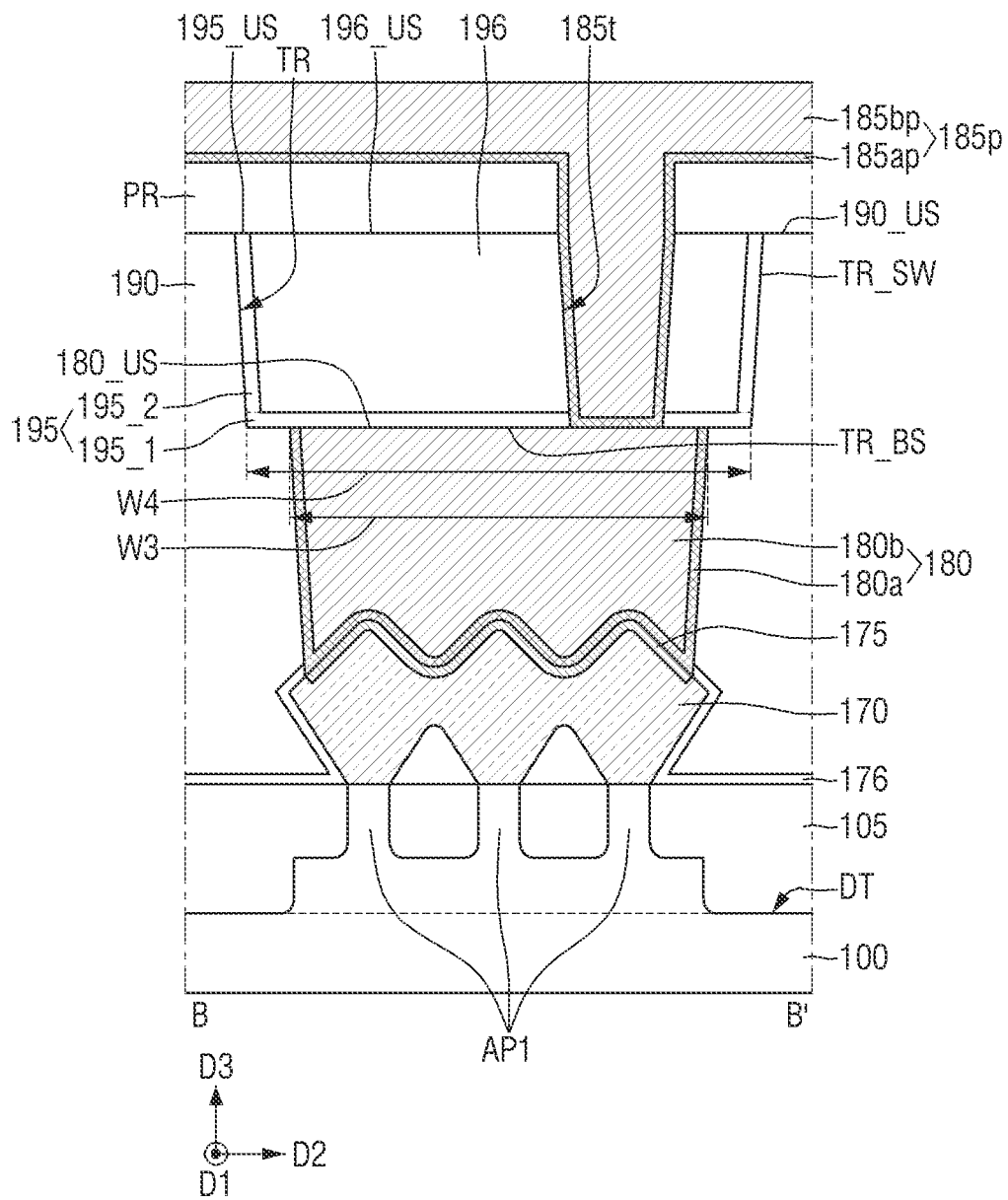

Referring to FIGS. 30 and 31, a pre upper active contact 185p that fills the upper active contact hole 185t and covers the upper surface of the photosensitive film PR may be formed.

The pre upper active contact 185p may include a pre upper active contact barrier film 185ap and a pre upper active contact filling film 185bp. The pre upper active contact barrier film 185ap may be formed along the side walls of the upper active contact hole 185t, the bottom surface of the upper active contact hole 185t and the upper surface of the photosensitive film PR. A pre upper active contact filling film 185bp may be formed on the pre upper active contact barrier film 185ap.

The contents of each of the materials included in the pre upper active contact barrier film 185ap and the pre upper active contact filling film 185bp may be the same as the description of the materials included in the lower active contact barrier film 180a and the lower active contact filling film 180b, and reference is made to the discussion thereof in the interest of brevity.

Figure 32:
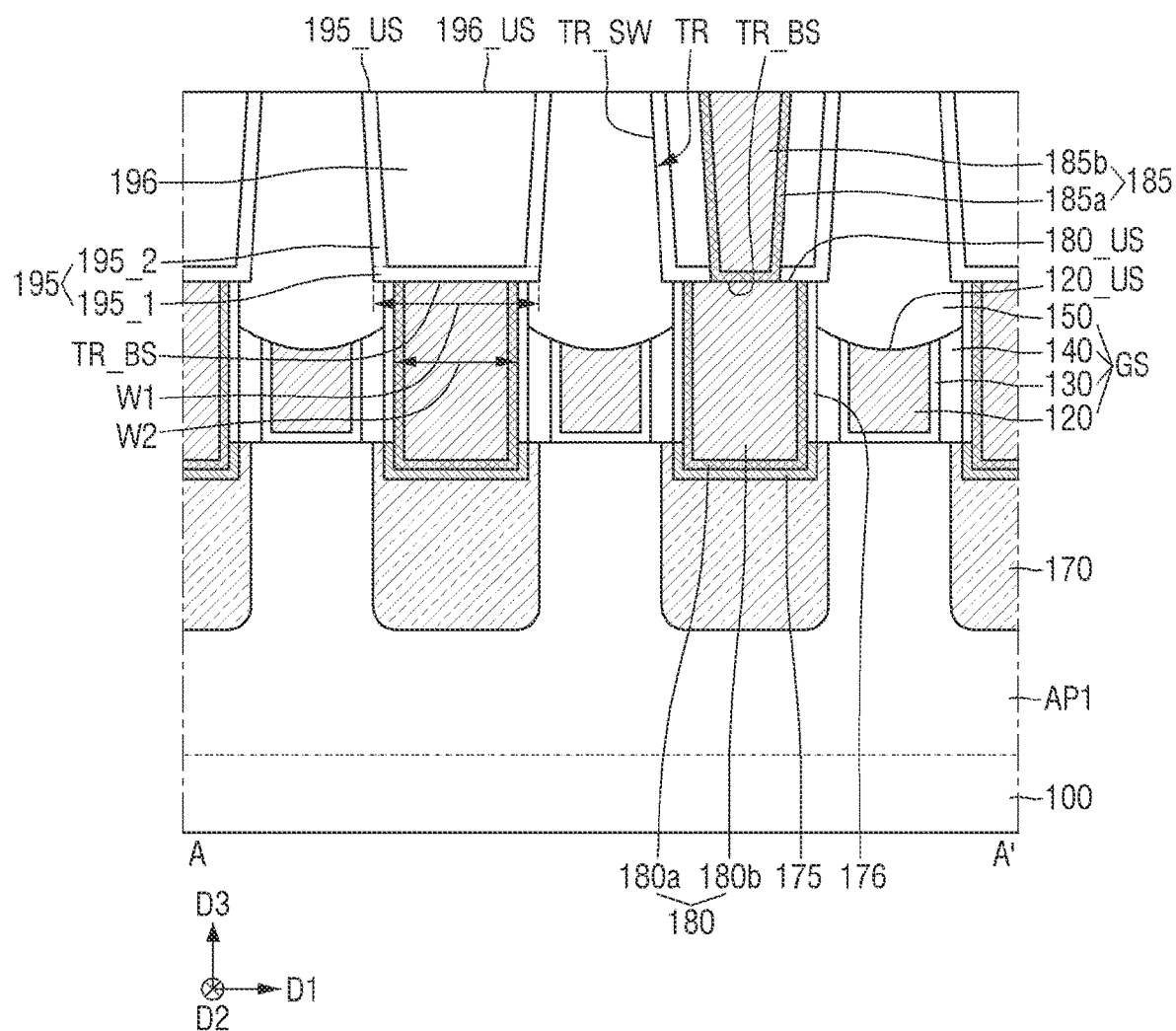
Figure 33:
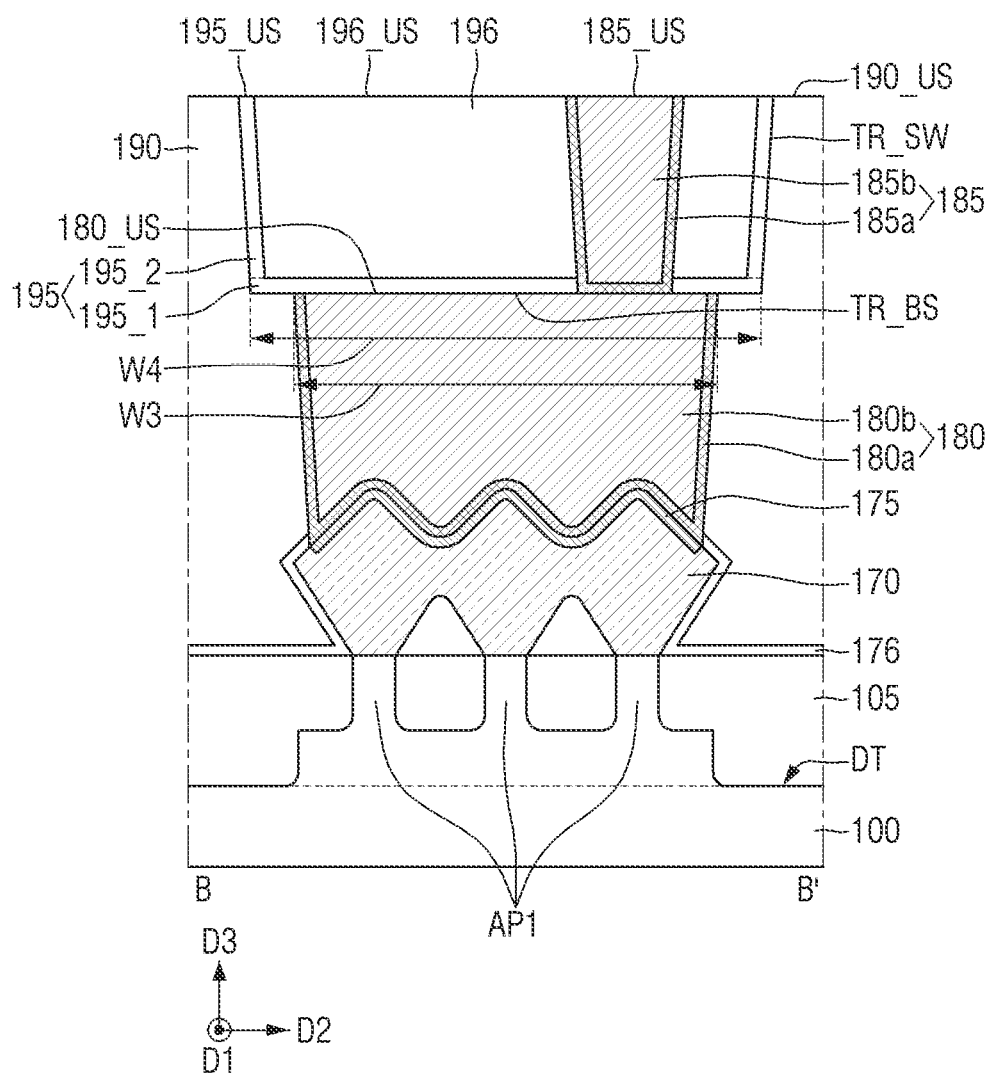

Referring to FIGS. 32 and 33, the pre upper active contact barrier film 185ap and the pre upper active contact filling film 185bp may be removed, using a chemical mechanical polishing (CMP) process.

The pre upper active contact barrier film 185ap and the pre upper active contact filling film 185bp may be removed to form an upper active contact 185. The upper active contact 185 may be, but is not limited to, a multi-film including the upper active contact barrier film 185a and the upper active contact filling film 185b.

Figure 34:
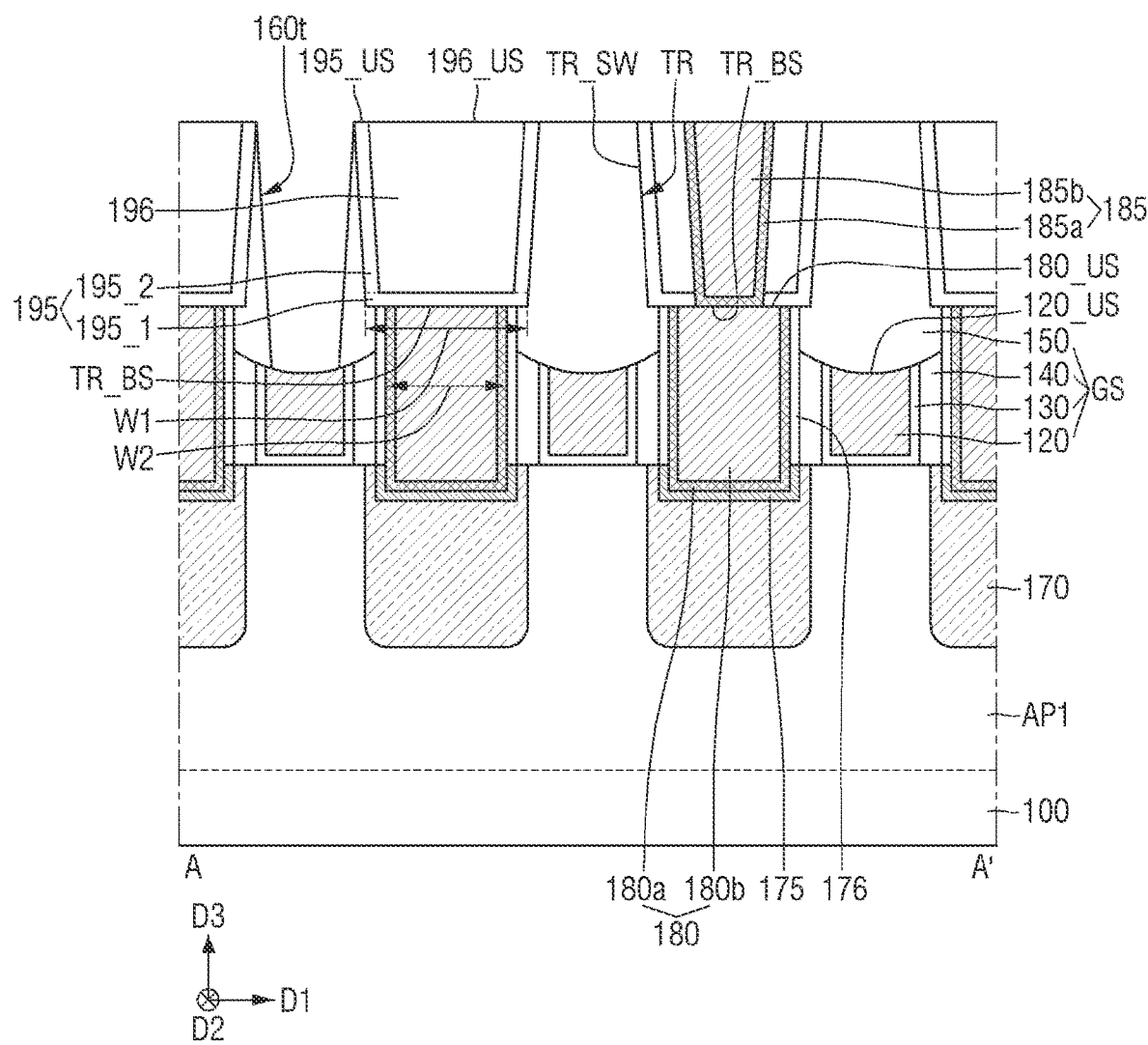

Referring to FIG. 34, a gate contact hole 160t may be formed, using the etching stop film 195 as a mask.

The gate contact hole 160t may be formed to penetrate or extend through the gate capping pattern 150 in the third direction D3. The gate contact hole 160t may expose the gate electrode 120. The width of the uppermost part of the gate contact hole 160t in the first direction D1 is the same as or equal to the width in the first direction D1 between the adjacent etching stop films 195.

Figure 35:
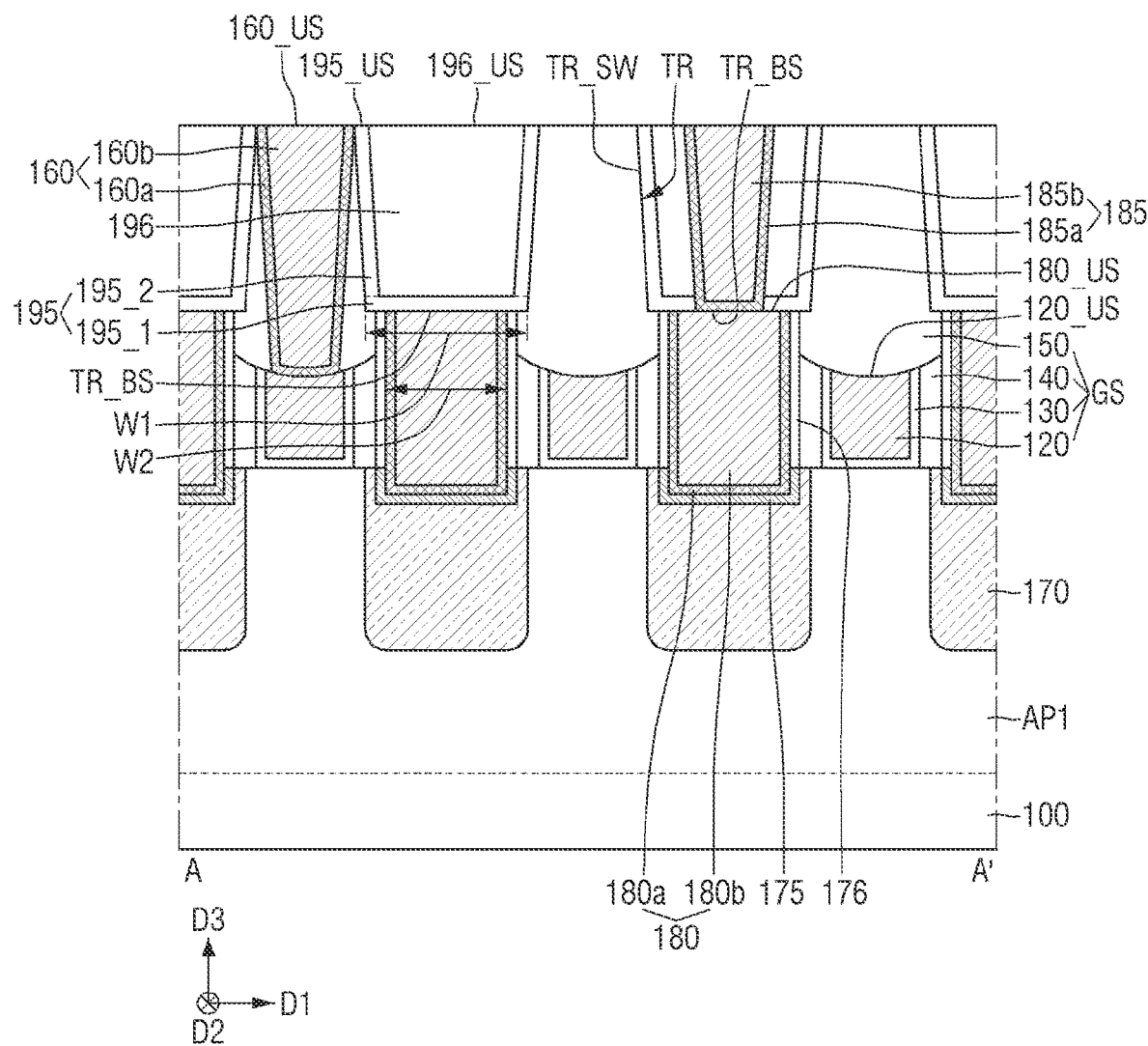

Referring to FIG. 35, a first gate contact 160 that fills the gate contact hole 160t may be formed.

The first gate contact 160 may be, but is not limited to, a multi-film that includes the gate contact barrier film 160a and the gate contact filling film 160b.

The width of the upper surface 160_US of the first gate contact 160 in the first direction D1 may be the same as or equal to the width in the first direction D1 between the uppermost surfaces 195_US of the adjacent etching stop films 195.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device comprising:
    a substrate;
    an active pattern that extends in a first direction, on the substrate;
    a plurality of gate structures on the active pattern, each gate structure including a gate electrode that crosses the active pattern and extends in a second direction that intersects in the first direction, and each gate structure including a gate capping pattern on the gate electrode thereof;
    a source/drain pattern on the active pattern and between two adjacent gate structures;
    a lower active contact on and connected to the source/drain pattern;
    a silicide film between the lower active contact and the source/drain pattern;
    a trench that is on the silicide film and the lower active contact and exposes the lower active contact, wherein a width of a bottom surface of the trench in the first direction is greater than a width of an upper surface of the lower active contact in the first direction;

an etching stop film along the bottom surface and side walls of the trench; and an upper active contact that extends through the etching stop film, is in the trench, and is connected to the lower active contact, wherein an uppermost surface of the etching stop film is coplanar with an uppermost surface of the upper active contact.

2. The semiconductor device of claim 1, wherein an upper surface of the gate electrode is nearer an upper surface of the substrate than the upper surface of the lower active contact is to the upper surface of the substrate.

3. The semiconductor device of claim 1, wherein the side walls of the trench are free of overlap with the gate electrode in a third direction that intersects the first direction and the second direction.

4. The semiconductor device of claim 1, further comprising:

a filling insulation film within at least a part of the trench and on the etching stop film, wherein the upper active contact extends through the filling insulation film.

5. The semiconductor device of claim 1, further comprising:

a protective film that extends to the bottom surface of the trench and is along side walls of each gate structure.

6. The semiconductor device of claim 1, wherein a width of the bottom surface of the trench in the second direction is greater than a width of the lower active contact in the second direction.

7. The semiconductor device of claim 1, wherein the etching stop film includes aluminum oxide or aluminum nitride.

8. The semiconductor device of claim 1, wherein the etching stop film includes a first portion that is along the bottom surface of the trench and a second portion that is on the first portion and along the side walls of the trench, and wherein the upper active contact is free from contact with the second portion of the etching stop film.

9. The semiconductor device of claim 8, wherein the second portion of the etching stop film is free from overlap with the lower active contact in a third direction that intersects the first direction and the second direction.

10. The semiconductor device of claim 8, wherein a width of the first portion of the etching stop film in the first direction is greater than a width of the lower active contact in the first direction.

11. The semiconductor device of claim 1, further comprising:

a gate contact on and connected to the gate electrode, wherein a width of an upper surface of the gate contact in the first direction is equal to a width in the first direction between uppermost surfaces of adjacent etching stop films.

12. A semiconductor device comprising:

a substrate;

an active pattern extending on the substrate in a first direction;

a plurality of gate structures on the active pattern, each gate structure including a gate electrode crosses the active pattern and extends in a second direction that intersects the first direction;

a source/drain pattern on the active pattern and between the gate structures;

a lower active contact on and connected to the source/drain pattern;

a silicide film between the lower active contact and the source/drain pattern;

an interlayer insulating film that is on the substrate and covers side walls of the lower active contact, the interlayer insulating film including a trench that is on the silicide film and the lower active contact and exposes the lower active contact;

an etching stop film on a bottom surface of the trench and side walls of the trench;

a filling insulation film within the trench and on the etching stop film; and an upper active contact that extends through the filling insulation film and the etching stop film, is in the trench, and is connected to the lower active contact, wherein an uppermost surface of the etching stop film is coplanar with an uppermost surface of the upper active contact and an uppermost surface of the interlayer insulating film, wherein the etching stop film includes a first portion on the bottom surface of the trench and a second portion on the first portion and on the side walls of the trench, and wherein a width between the second portion in the second direction is greater than a width of an upper surface of the lower active contact in the second direction.

13. The semiconductor device of claim 12, wherein the upper active contact is free from contact with the first portion of the etching stop film.

14. The semiconductor device of claim 12, wherein the uppermost surface of the upper active contact is coplanar with an upper surface of the filling insulation film.

15. The semiconductor device of claim 12, wherein the filling insulation film includes silicon nitride, silicon oxycarbide, or silicon oxide.

16. The semiconductor device of claim 12, wherein the etching stop film includes aluminum oxide or aluminum nitride.

17. A semiconductor device comprising:

a substrate;

an active pattern on the substrate and extending in a first direction that is parallel to an upper surface of the substrate;

a plurality of gate structures on the active pattern, each gate structure including a gate electrode that crosses the active pattern and extends in a second direction that intersects the first direction, each gate structure further including a gate capping pattern on the gate electrode thereof;

a source/drain pattern on the active pattern and between the gate structures;

a lower active contact on and connected to the source/drain pattern;

a silicide film between the lower active contact and the source/drain pattern;

an interlayer insulating film on the substrate that covers side walls of the lower active contact, the interlayer insulating film including a trench that is on the silicide film and the lower active contact and exposes the lower active contact;

an etching stop film on a bottom surface of the trench and side walls of the trench;

a filling insulation film within the trench and on the etching stop film; and an upper active contact that extends through the filling insulation film and the etching stop film, is in the trench, and is connected to the lower active contact, wherein an uppermost surface of the etching stop film is coplanar with an upper surface of the upper active contact, wherein a width of the bottom surface of the trench in the first direction is greater than a width of an upper surface of the lower active contact in the first direction, wherein a width of the bottom surface of the trench in the second direction is greater than a width of the upper surface of the lower active contact in the second direction, and wherein the trench and the lower active contact are free from overlap in the first direction.

18. The semiconductor device of claim 17, wherein the etching stop film includes aluminum oxide or aluminum nitride.

\* \* \* \* \*